(12) United States Patent
Shimada et al.

(10) Patent No.: US 6,504,705 B2
(45) Date of Patent: Jan. 7, 2003

(54) ELECTROLYTIC CAPACITOR, CIRCUIT BOARD CONTAINING ELECTROLYTIC CAPACITOR, AND METHOD FOR PRODUCING THE SAME

(75) Inventors: Mikinari Shimada, Kyoto (JP); Yasuhiko Nakada, Osaka (JP); Seiichi Nakatani, Osaka (JP); Seigo Shiraishi, Osaka (JP); Hiroyuki Handa, Osaka (JP); Akihiro Ishikawa, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/976,438

(22) Filed: Oct. 11, 2001

(65) Prior Publication Data
US 2002/0075633 A1 Jun. 20, 2002

(30) Foreign Application Priority Data
Oct. 12, 2000 (JP) .................................. 2000-311603

(51) Int. Cl.[7] ................................................ H01G 9/04
(52) U.S. Cl. ........................ 361/528; 361/523; 361/529; 29/25.03
(58) Field of Search ................. 361/523, 528, 361/529, 530, 508, 509, 531, 532; 29/25.03

(56) References Cited

U.S. PATENT DOCUMENTS

| | | |
|---|---|---|
| 4,166,286 A | 8/1979 | Boissonnault |
| 4,184,192 A | 1/1980 | Yoshida et al. |
| 5,005,107 A | 4/1991 | Kobashi et al. |
| 5,122,931 A | 6/1992 | Shimada et al. |
| 6,246,569 B1 * | 6/2001 | Strange et al. ............. 29/25.03 |
| 6,310,765 B1 | 10/2001 | Tanahashi et al. |

FOREIGN PATENT DOCUMENTS

| | | |
|---|---|---|
| EP | 886 288 | 12/1998 |
| JP | 62-189716 | 8/1987 |
| JP | 1-296608 | 11/1989 |
| JP | 4-48616 | 2/1992 |
| JP | 4-243116 | 8/1992 |
| JP | 6-204094 | 7/1994 |
| JP | 11-26320 | 1/1999 |
| JP | 11-219861 | 8/1999 |

* cited by examiner

*Primary Examiner*—Anthony Dinkins
(74) *Attorney, Agent, or Firm*—Merchant & Gould P.C.

(57) ABSTRACT

In an electrolytic capacitor of the present invention, a dielectric layer is provided on a surface of a valve metal element for an anode having a capacitor forming part and an electrode lead part, and further, a solid electrolyte layer and a charge collecting layer for a cathode are provided in this order thereon. The capacitor forming part and the electrode lead part of the valve metal element for an anode have rough surface layers on their surfaces, and are compressed in the thickness direction of the rough surface layers. Further, a region other than the electrode lead part and the charge collecting element for cathode is molded with a molding material. Exposed portions of the electrode lead part and the charge collecting element for cathode function as electrode terminals, respectively.

23 Claims, 11 Drawing Sheets

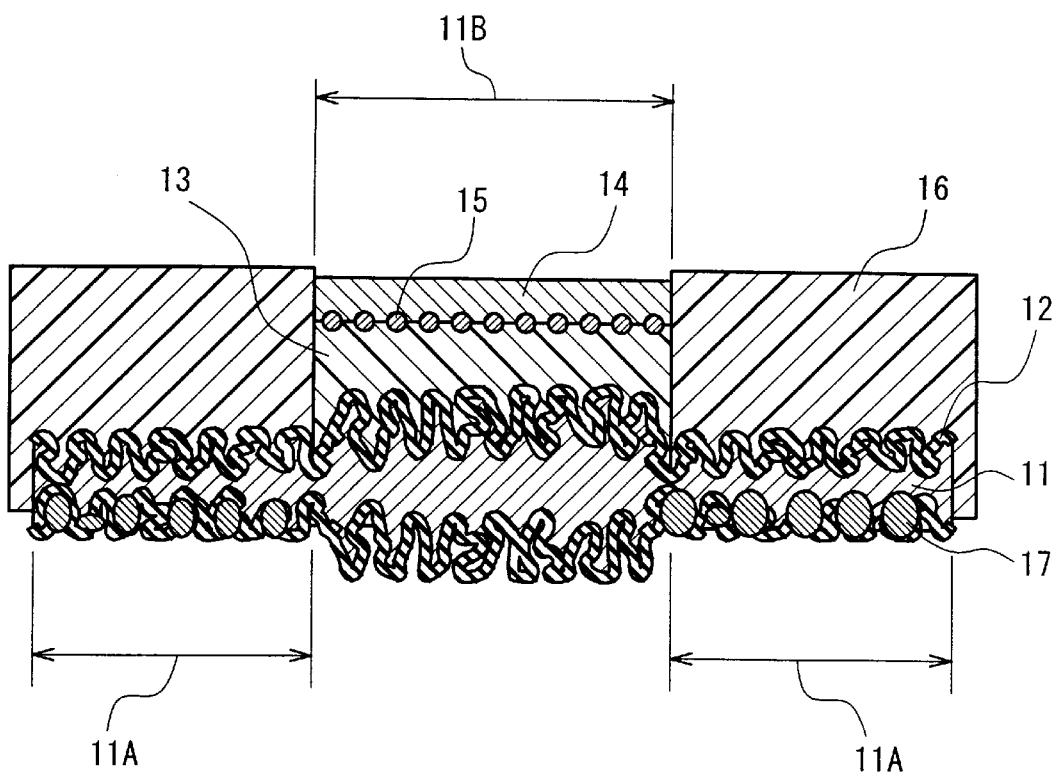
F I G. 3 A
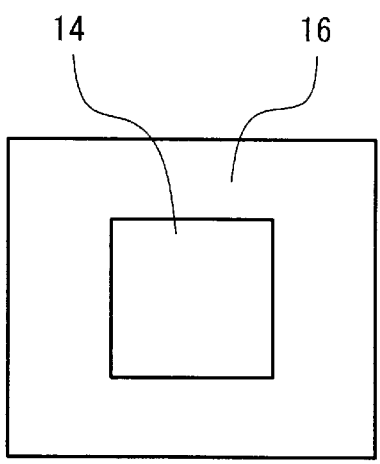
F I G. 3 B
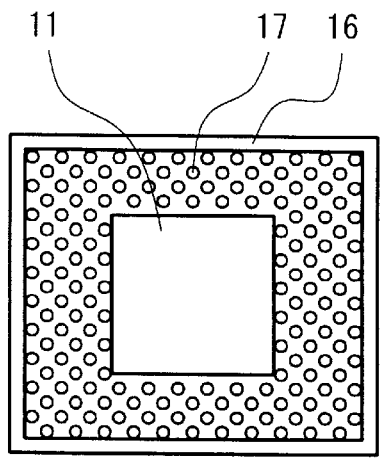
F I G. 3 C

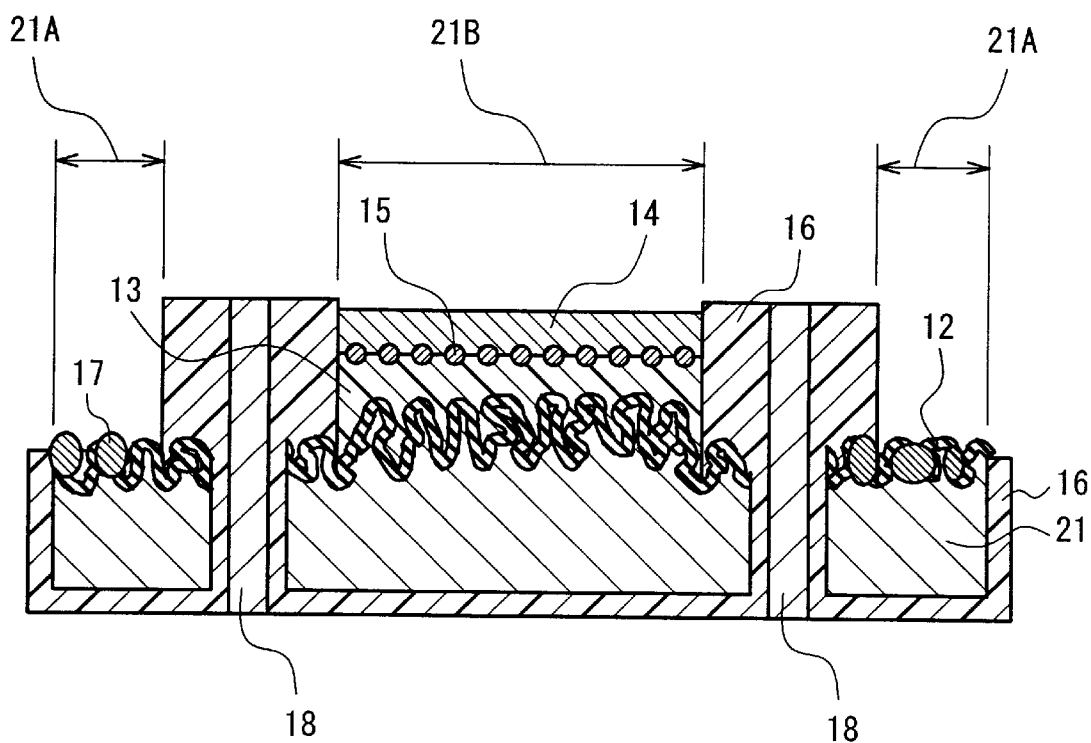
F I G. 5

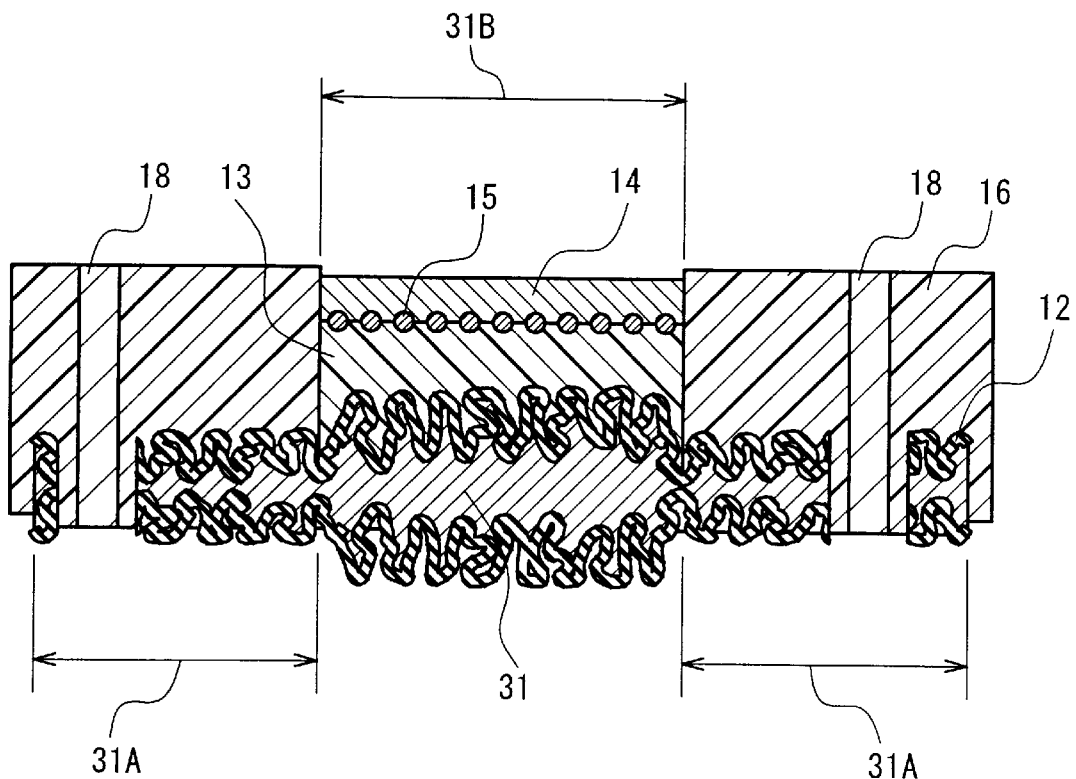
F I G. 6 A
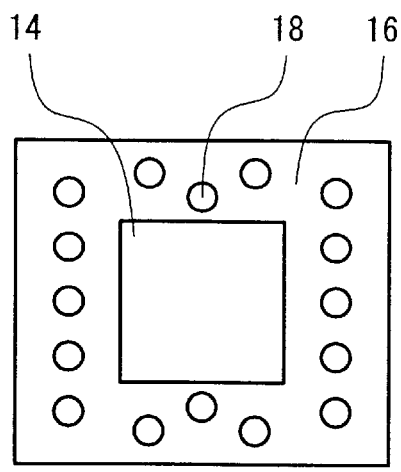
F I G. 6 B
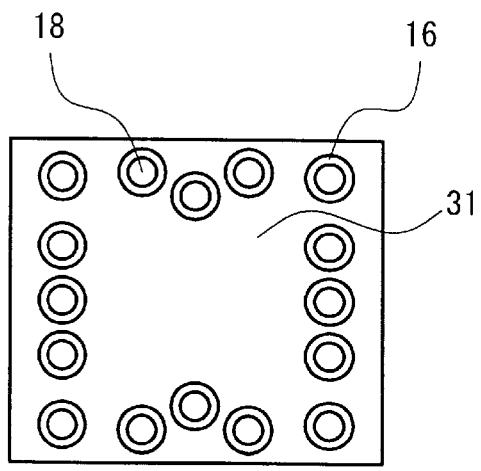
F I G. 6 C

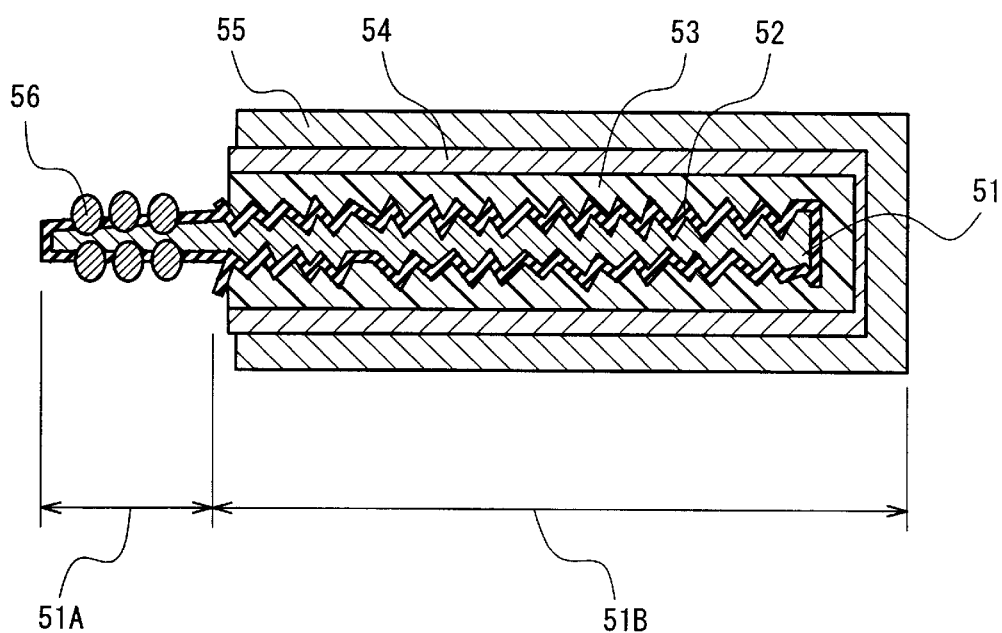
F I G. 8

ELECTROLYTIC CAPACITOR, CIRCUIT BOARD CONTAINING ELECTROLYTIC CAPACITOR, AND METHOD FOR PRODUCING THE SAME

BACKGROUND OF THE INVENTION

1. Field of the Invention

The present invention relates generally to an electrolytic capacitor that can be built in a board, for use in a high-speed power source circuit, to a circuit board containing an electrolytic capacitor, and to a method for producing the same.

2. Related Background Art

Conventionally, an electrolytic capacitor in which a valve metal such as aluminum or tantalum is used, and a multilayered ceramic capacitor in which Ag/Pd or Ni is used for electrodes and barium titanate is used as a dielectric, have been known as capacitors. These capacitors are used in many power source circuits. Recently, since CPU driving circuits and switching power source circuits particularly are required to be driven with a lower driving voltage, to consume less power, and to be fitted for high frequencies, a capacitor also is required to have a large capacitance, a low equivalent series resistance (hereinafter referred to as ESR), and a low equivalent series inductance (hereinafter referred to as ESL). To meet with these requirements, particularly for a capacitor to have a low ESR, a technique in which a specialty polymer having a high electroconductivity (conductive polymer) is used as a solid electrolyte for a cathode has been examined and developed.

A configuration of a conventional specialty polymer electrolytic capacitor is described below, with reference to FIG. 11. FIG. 11 is a cross-sectional view of a conventional specialty polymer electrolytic capacitor. In FIG. 10, 101 denotes an aluminum foil for an anode (hereinafter referred to as anode-use aluminum foil). 102 denotes a dielectric layer. 103 denotes a conductive polymer layer. 104 denotes a carbon layer. 105 denotes an Ag paste layer. 106 denotes a lead frame. 107 denotes a lead frame. 108 denotes a molding resin.

The anode-use aluminum foil 101 has been treated so as to have rough surfaces, and is provided with the dielectric layer 102 on the surfaces. On the surfaces of the anode-use aluminum foil 101 provided with the dielectric layer 102, the conductive polymer layer 103 made of polypyrrole, polythiophene, polyaniline, etc. is formed. Furthermore, on the conductive polymer layer 103, the carbon layer 104 and the Ag paste layer 105 are formed in the stated order, so that a conventional capacitor unit is provided. Further, the lead frame 106 and the lead frame 107 that function as an anode terminal and as a cathode terminal, respectively, are bonded with the foregoing conventional capacitor unit, and the capacitor unit is sealed with the molding resin 108. Thus, the conventional specialty polymer electrolytic capacitor is formed.

Such a conventional specialty polymer electrolytic capacitor has a lower ESR than that of an electrolytic capacitor using an electrolytic solution as the electrolyte (hereinafter referred to as an electrolytic solution-type electrolytic capacitor). To further increase the capacitance and decrease the ESR, however, a configuration in which a plurality of conventional capacitor units are laminated with an Ag adhesive (Ag adhesive paste) has been developed. Furthermore, as to the foregoing conventional capacitor unit, to decrease the ESR thereof further, materials for the conductive polymer layer 103, the carbon layer 104, and the Ag paste layer 105 have been developed.

Furthermore, recently, the development of capacitors arranged so that not only the ESRs but also the ESLs of the same are reduced for suppression of voltage falling due to inductance components has been needed, for use in high-frequency driving circuits such as MPU power source circuits. Therefore, small-size multilayered ceramic capacitors with small ESLs and electrolytic capacitors with three terminals or four terminals have been developed. Furthermore, circuit boards provided with such capacitors are required to allow LSIs to be driven with high frequencies, in addition to meeting requests for reduction in size and thickness. To obtain such a circuit board, it is necessary to shorten wirings and connections. Therefore, a technique of, for instance, burying a capacitor in a circuit board so as to dispose the capacitor closer to an LSI and thereby reducing inductance components of wirings has been developed.

In the case of the conventional specialty polymer electrolytic capacitor having the aforementioned configuration, however, lead frames are provided as an anode terminal and a cathode terminal, and further, the capacitor unit is larger in size. Therefore, a product of the same has a relatively large size. This makes it difficult to obtain an ESL value lower than 1 nH in the conventional specialty polymer electrolytic capacitor. For this reason, the conventional specialty polymer electrolytic capacitor, whose ESL hardly is reduced despite having a reduced ESR, is inferior to a multilayered ceramic capacitor, which is small in size as a capacitor used in a high-frequency-driven circuit.

On the other hand, as described above, in the case of a high-frequency-driving circuit, which requires the shortening of wirings and connections, a technique of burying a capacitor unit in a circuit board has been developed. However, if the conventional specialty polymer electrolytic capacitor is embedded in the circuit board as it is, serious problems have arisen. Namely, an anode-use valve metal foil having rough surfaces (an etching layer of the anode-use aluminum foil 101 in FIG. 11) and a dielectric (the dielectric layer 102 in FIG. 11) are broken due to stress and the like during a burying operation, thereby causing short circuits to occur and causing leak current to increase. Thus, it has been difficult to obtain sufficient characteristics and reliability by burying the conventional specialty polymer electrolytic capacitor in a circuit board. On the other hand, in the case where a multilayered ceramic capacitor is embedded in a circuit board as well, a drawback is that the multilayered ceramic capacitor is broken due to stress and the like upon a burying operation.

Furthermore, in the case where the conventional specialty polymer electrolytic capacitor is embedded in a circuit board, problems to be solved are present also in the connection of the capacitor with circuit wiring. When a specialty polymer electrolytic capacitor of a conventional lead frame structure is connected with circuit wiring, the lead frame and the circuit wiring are connected by soldering. In this case, the shortening of the connections cannot be achieved, and it is difficult to drive a circuit with a high frequency.

SUMMARY OF THE INVENTION

Therefore, with the foregoing in mind, it is an object of the present invention to provide an electrolytic capacitor with a reduced ESL such that the occurrence of short circuits and an increase in leak current can be suppressed when the electrolytic capacitor is embedded in a circuit board, and a method for producing the same, as well as an electrolyticcapacitor-containing circuit board that ensures high-frequency response and large-current driving, and a method for producing the same.

To achieve the foregoing object, an electrolytic capacitor of the present invention includes a valve metal element for an anode including a capacitor forming part and an electrode lead part, a dielectric layer provided on a surface of the valve metal element for an anode, a solid electrolyte layer provided on the dielectric layer, and a charge collecting element for a cathode provided on the solid electrolyte layer. In the electrolytic capacitor, in the valve metal element for an anode, the capacitor forming part and the electrode lead part have a rough surface layer on surfaces thereof, and is compressed in a thickness direction of the rough surface layer.

The electrolytic capacitor is formed using a valve metal element for an anode in a state of being compressed in the thickness direction of the rough surface layer after the surface roughening treatment. Since the valve metal element for an anode is compressed beforehand, it is possible to avoid damage to the rough surface layer of the valve metal element for an anode and to the dielectric layer that is generated due to the stress during a laminating operation, a molding operation, or when the electrolytic capacitor is built in a circuit board. Therefore, it is possible to provide an electrolytic capacitor with high reliability, in which the occurrence of short circuits and an increase in leak current due to stress generated when the electrolytic capacitor is built in a circuit board.

Furthermore, the compression of the valve metal element for anode provides an effect of thinning the capacitor as a whole, thereby ensuring a reduction of the ESL. Furthermore, since it is possible to use the electrode lead part provided in the valve metal element for an anode and the charge collecting element for a cathode as connection terminals, the electrolytic capacitor of the present invention is allowed to have connection terminals for the upper and lower surfaces instead of lead frames. Therefore, this provides reduction of the size of the capacitor as a whole, as well as the shortening of connections in the case where the capacitor is built in a circuit board. Consequently, this ensures further reduction of the ESL, as well as high-frequency driving of a circuit in the case where the capacitor is built in the capacitor.

Furthermore, in the electrolytic capacitor of the present invention, the electrode lead part of the valve metal element for an anode has a rough surface layer on a surface thereof, and is compressed in a thickness direction of the rough surface layer. Therefore, a bulk resistance of the rough surface layer can be lowered in the case where the electrode lead part and circuit wiring are connected electrically. Consequently, this allows resistances upon electric connection with the circuit wiring to be lowered and stabilized, thereby suppressing an increase in the ESR when the capacitor is built in the circuit.

Furthermore, the electrolytic capacitor of the present invention preferably further includes a conductive via hole bored completely through in a thickness direction, and the conductive via hole is provided in a region other than the capacitor forming part, and are insulated electrically from the valve metal element for anode, the solid electrolyte layer, and the charge collecting element for cathode.

This allows electric wiring to pass through the electrolytic capacitor when the electrolytic capacitor is built in a circuit board. Therefore, high densification and high performance can be achieved.

Furthermore, in the electrolytic capacitor of the present invention, a thickness index of the rough surface layer after compression in the capacitor forming part preferably is not less than 0.5 and less than 1.0. Here, the thickness index of the rough surface layer after compression is a thickness of the rough surface layer after compression in the case where a thickness of the rough surface layer before compression is assumed to be 1.

According to the foregoing electrolytic capacitor, the compression provides an effect of an increase in a capacitance.

Furthermore, in the electrolytic capacitor of the present invention, a thickness index of the rough surface layer after compression in the electrode lead part preferably is not more than 0.5. Here, the thickness index of the rough surface layer after compression is as described above.

According to the foregoing electrolytic capacitor, the connection resistance in the case where the capacitor is built in a circuit board can be decreased further.

Furthermore, in the electrolytic capacitor of the present invention, conductive particles preferably are embedded in the electrode lead part so that the conductive particles are exposed on a surface of the electrode lead part. Besides, the conductive particles preferably are selected from the group consisting of Au particles, Ag particles, Cu particles, Ni particles, and C particles.

The foregoing configuration allows further lowering and stabilization of resistances when the electrode lead part and circuit wiring are connected electrically.

Furthermore, in the electrolytic capacitor of the present invention, the charge collecting element for cathode preferably is made of a metal foil in which carbon particles are embedded so that the particles are exposed on a surface of the metal foil.

According to the foregoing electrolytic capacitor, an interface resistance between the charge collecting element for cathode and the solid electrolyte layer is decreased, whereby the ESR is further reduced.

Furthermore, in the electrolytic capacitor of the present invention, the charge collecting element for cathode may be a cladding material, the cladding material including (i) a metal foil in which carbon particles are embedded so that the particles are exposed on a surface of the metal foil, and (ii) a cladding layer.

Furthermore, in the electrolytic capacitor of the present invention, the capacitor forming part and the electrode lead part preferably are provided on a same plane of the valve metal element for an anode.

According to the foregoing electrolytic capacitor, in the case where the electrolytic capacitor of the present embodiment is built in a circuit board, it is possible to obtain lead wires from the anode and the cathode from the same side of the electrolytic capacitor. Therefore, this allows the wiring to be shortened. This allows the electrolytic capacitor to operate sufficiently for high-frequency driving of the circuit.

Furthermore, in the electrolytic capacitor of the present invention, the capacitor forming part may be provided on a first side of the valve metal element for an anode and the electrode lead part may be provided on a second side of the valve metal element for an anode, the second side being opposite to the first side.

Furthermore, in the electrolytic capacitor of the present invention, the valve metal element for anode may include a valve metal layer and a metal layer. Herein the metal layer preferably is made of Cu or Ni.

Furthermore, in the electrolytic capacitor of the present invention, a region other than a predetermined portion of the electrode lead part and a predetermined portion of the charge collecting element for a cathode preferably is sealed with a molding material. Furthermore, by sealing the electrolytic capacitor so that at least one of the electrode lead part and the charge collecting element for a cathode has a plurality of portions uncovered with the molding material, a three-terminal structure or a four-terminal structure can be obtained, whereby the ESL can be decreased further.

To achieve the aforementioned object, a method of the present invention for producing the foregoing electrolytic capacitor includes the steps of roughening at least a surface of a portion of the valve metal element for an anode, the portion being to be the capacitor forming part and the electrode lead part, and compressing the roughened surface portion of the valve metal element for an anode in the thickness direction.

Furthermore, in the electrolytic capacitor producing method of the present invention, the compressing step preferably is carried out so that a thickness index of the rough surface layer after compression in the capacitor forming part is not less than 0.5 and less than 1.0. Here, the thickness index of the rough surface layer after compression is a thickness of the rough surface layer after compression in the case where a thickness of the rough surface layer before compression is assumed to be 1.

Furthermore, in the electrolytic capacitor producing method of the present invention, the compressing step is carried out so that a thickness index of the rough surface layer after compression in the electrode lead part is not more than 0.5. Here, the thickness index of the rough surface layer after compression is as described above.

Furthermore, the electrolytic capacitor producing method of the present invention further may include the step of placing conductive particles on the electrode lead part in a state in which the dielectric layer is formed on a surface of the electrode lead part, and compressing the electrode lead part so that the conductive particles are embedded in the electrode lead part.

Furthermore, the electrolytic capacitor producing method of the present invention preferably further includes the steps of forming the dielectric layer, forming the solid electrolyte layer, and repairing the dielectric layer, wherein the roughening step, the dielectric layer forming step, the solid electrolyte layer forming step, the compressing step, and the dielectric layer repairing step are carried out in the stated order.

According to these methods, it is possible to produce an electrolytic capacitor that can be built in a circuit board, with a minimum of influences of stress to the electrolytic capacitor when the electrolytic capacitor is built in a circuit board.

An electrolytic-capacitor-containing circuit board of the present invention includes the electrolytic capacitor of the present invention.

Furthermore, in the electrolytic-capacitor-containing circuit board of the present invention, the electrolytic capacitor of the present invention may be embedded in an insulation material having a wire layer, and the electrode lead part of the valve metal element for an anode and the charge collecting element for a cathode may be connected individually with the wire layer. The insulation material preferably is a composite material containing inorganic material particles and a thermosetting resin.

This configuration of the foregoing electrolytic-capacitor-containing circuit board of the present invention allows the circuit board to be capable of high-frequency response and large-current driving.

Furthermore, an electrolytic-capacitor-containing circuit board producing method of the present invention includes the step of burying the electrolytic capacitor in the insulation material in a non-cured state by pressing, wherein a pressure in the burying step is smaller than a pressure applied to the capacitor forming part of the valve metal element for an anode of the electrolytic capacitor when it is compressed.

By the foregoing method, it is possible to build an electrolytic capacitor in a circuit board while suppressing occurrence of short circuits and an increase in leak current in the electrolytic capacitor.

These and other objects, characteristics, and advantages will be fully revealed by the following description. The benefits of the present invention will become apparent to those skilled in the art upon reading and understanding the following detailed description with reference to the accompanying figures.

BRIEF DESCRIPTION OF THE DRAWINGS

FIG. 3A is a cross-sectional view illustrating a configuration of an electrolytic capacitor according to a second embodiment of the present invention, FIG. 3B is a top view of the electrolytic capacitor, and FIG. 3C is a bottom view of the electrolytic capacitor.

FIG. 5 is a cross-sectional view illustrating a configuration of an electrolytic capacitor according to a fourth embodiment of the present invention.

FIG. 6A is a cross-sectional view illustrating a configuration of an electrolytic capacitor according to a fifth embodiment of the present invention, FIG. 6B is a top view of the electrolytic capacitor, and FIG. 6C is a bottom view of the electrolytic capacitor.

FIG. 8 is a cross sectional view illustrating a configuration of an electrolytic capacitor according to a seventh embodiment of the present invention.

DETAILED DESCRIPTION OF THE INVENTION

Figure 1A:
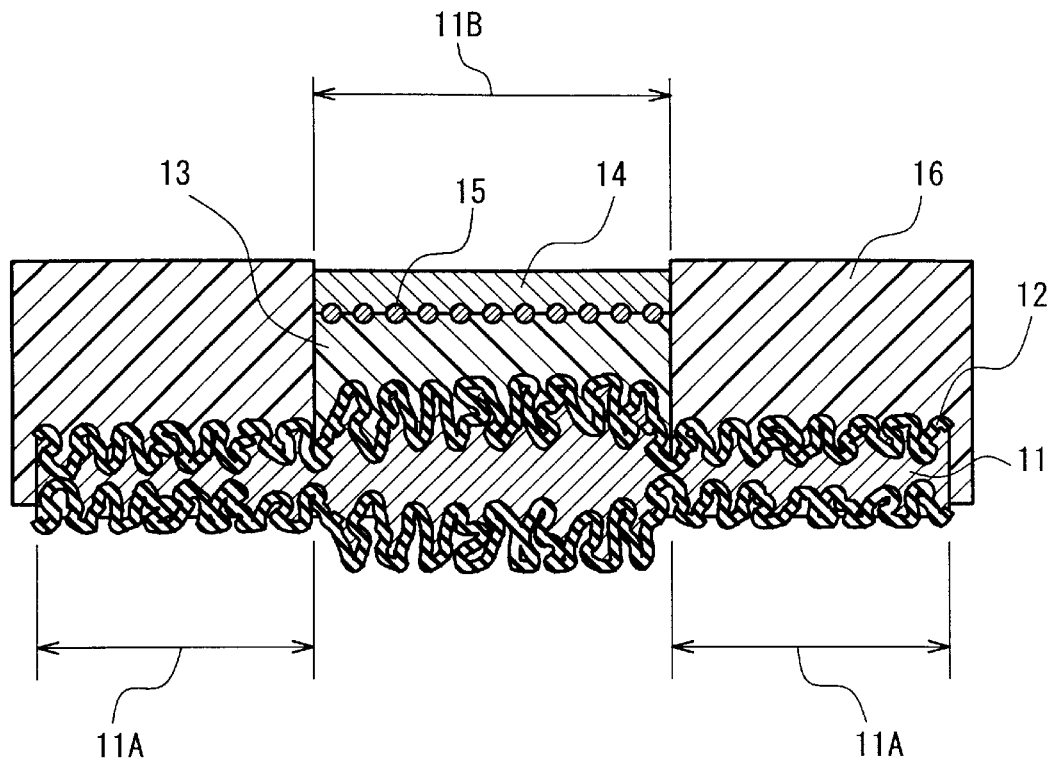
FIG. 1A is a cross-sectional view illustrating a configuration of an electrolytic capacitor according to a first embodiment of the present invention.

The following description will depict an embodiment of the present invention, while referring to the drawings.

First Embodiment

Figures 1B, 1C:
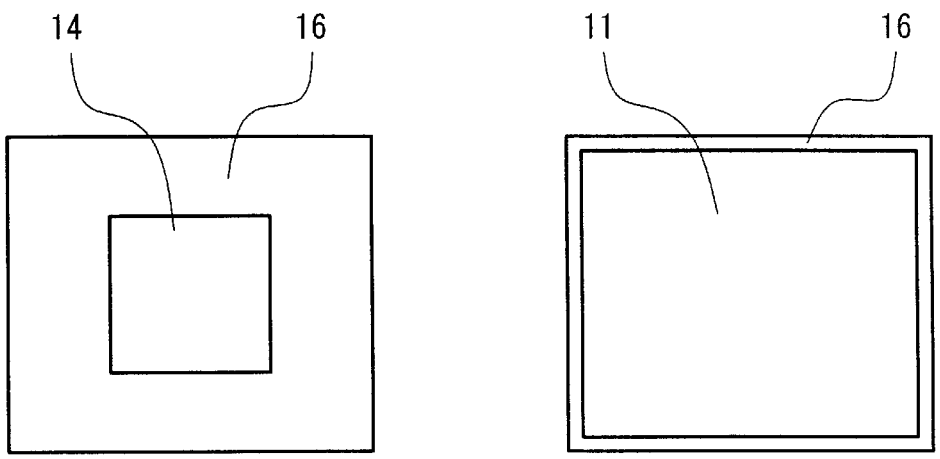
FIG. 1B is a top view of the electrolytic capacitor.
FIG. 1C is a bottom view of the electrolytic capacitor.

FIGS. 1A to 1C illustrate schematic configurations of an electrolytic capacitor of the present embodiment. FIGS. 1A, 1B, and 1C are a cross-sectional view, a top view, and a bottom view of the same, respectively. It should be noted that the top and the bottom of the electrolytic capacitor are defined merely for convenience of description, and a top and a bottom of the electrolytic capacitor according to the present embodiment are not specified particularly, when it is used.

In FIGS. 1A to 1C, 11 denotes an anode-use valve metal foil, 12 denotes a dielectric layer, 13 denotes a solid electrolyte layer, 14 denotes a cathode-use charge collecting layer, 15 denotes a carbon particle, and 16 denotes a molding material. The anode-use valve metal foil 11 has surfaces roughened by electrolytic etching, and includes an electrode lead part 11A and a capacitor forming part 11B.

The following description will depict a configuration of an electrolytic capacitor of the present embodiment, while depicting an embodiment of an electrolytic capacitor producing method of the present invention.

First of all, for instance, an aluminum foil with a purity of 99.99% is subjected to electrolytic etching in an electrolytic solution mainly containing hydrochloric acid, with an alternating current applied thereto, so that the aluminum foil has rough surfaces. Thus, the anode-use valve metal foil 11 is formed.

Then, the capacitor forming part 11B of the anode-use valve metal foil 11 is pressed by a press machine having a predetermined press shape or the like, so that rough surface layers of the same are pressed. Herein, the rough surface layers are layers including a multiplicity of pits formed by etching. Subsequently, the electrode lead part 11A of the anode-use valve metal foil 11 is pressed by a press machine having a predetermined press shape or the like, so that rough surface layers of the same are compressed. Herein, the electrode lead part 11A is pressed under a higher pressure than that for the capacitor forming part 11B. Furthermore, as to the capacitor forming part 11B, a ratio of a thickness of the rough surface layer after the pressing to a thickness of the same before the pressing preferably is not less than 0.5. The electrode lead part 11A preferably has such a ratio of not more than 0.5.

Subsequently, the anode-use valve metal foil 11 is subjected to anodic oxidation in a neutral electrolytic solution, so that the dielectric layer 12 having a certain breakdown voltage is formed on surfaces of the anode-use valve metal foil 11. Next, a predetermined portion (portion except for the capacitor forming part 11B) of the anode-use valve metal foil 11 is masked with the molding material 16, and the solid electrolyte layer 13 made of polypyrrole, polythiophene, polyaniline, etc. is formed by chemical polymerization, or chemical polymerization and electrolytic polymerization in combination, using a solution containing a dopant and respective monomers.

On the other hand, as the cathode-use charge collecting layer 14, a Cu foil, a Ni-foil, or a foil obtained by embedding the carbon particles 15 in a surface part (surface part in contact with the solid electrolyte layer 13) of a Cu foil, a Ni foil, or an Al foil by pressing is used. On the surface of the cathode-use charge collecting layer 14, the conductive polymer layer made of polypyrrole, polythiophene, polyaniline, etc. may be formed by electrolytic polymerization using a solution containing a dopant and respective monomers. In the case where the cathode-use charge collecting layer 14 composed of a conductive polymer layer thus formed by electrolytic polymerization is used, the solid electrolyte layer 13 and the conductive polymer layer of the cathode-use charge collecting layer 14 may be bonded with a conductive polymer or a conductive paste. Further, the process for forming the cathode-use charge collecting layer 14 and the process for bonding the same with the solid electrolyte layer 13 are not limited to the above. It should be noted that in the foregoing bonding process, the bonding is carried out while the cathode-use charge collecting layer 14 is pressed under a pressure smaller than the pressure for pressing the capacitor forming part 11B. The cathode-use charge collecting layer 14, however, may be composed of a carbon layer and an Ag paste layer as conventionally.

Then, the whole except for portions of the electrode lead part 11A that are to serve as an anode terminal and an upper surface of the cathode-use charge collecting layer 14 that is to serve as a cathode terminal is sealed with the molding material 16 made of an epoxy resin containing an inorganic filler such as silica, etc.

Subsequently, defects of the dielectric layer 12 are corrected and the solid electrolyte layer 13 is insulated in an atmosphere of 80% RH at 85° C., with a predetermined voltage being applied. After drying, an electrolytic capacitor of the present embodiment is obtained.

As described above, an electrolytic capacitor of the present embodiment is formed using the anode-use valve metal foil 11 that is compressed in the thickness direction after the surface-roughening treatment. Since the anode-use valve metal foil 11 is pressed beforehand so as to be compressed, it is possible to prevent the breaking of the rough surface layer of the anode-use valve metal foil 11 and the dielectric layer 12, which occurs due to the stress applied thereto when the capacitor unit is embedded in a circuit board. Therefore, it is possible to suppress the occurrence of short circuits and an increase in leak current due to stress when an electrolytic capacitor is embedded in a circuit board, and hence, to obtain an electrolytic capacitor with high reliability.

Figure 2:
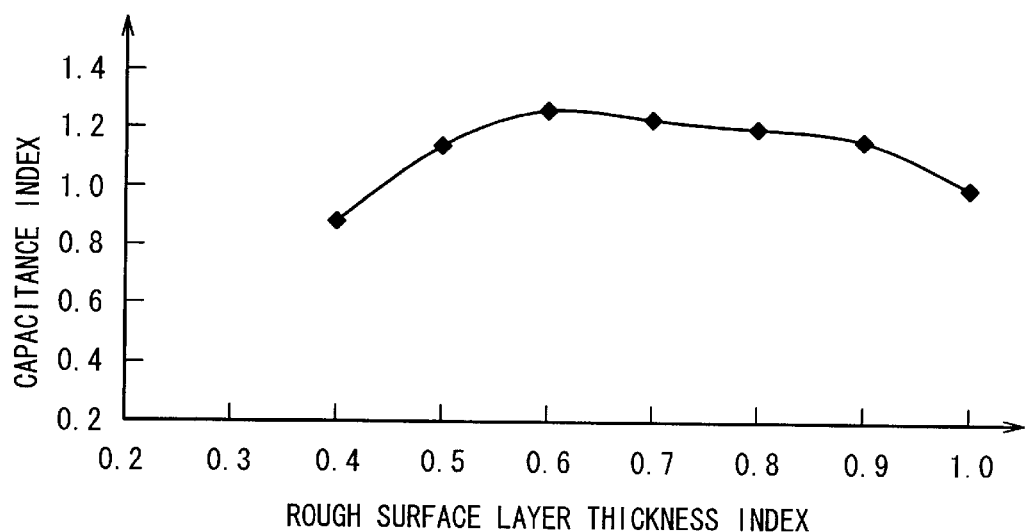
FIG. 2 is a diagram illustrating the relationship between a thickness index of a rough surface layer and a capacitance index.

Furthermore, the anode-use valve metal foil 11 has the electrode lead part 11A and the capacitor forming part 11B. FIG. 2 illustrates the relationship between the rough surface layer thickness index (compression level) of the anode-use valve metal foil 11 after pressing and a capacitance index per unit foil thickness. The rough surface layer thickness index of the rough surface layer after pressing is indicative of a thickness of the rough surface layer after compression in the case where the thickness of the rough surface layer before compression is assumed to be 1. On the other hand, the capacitance index after pressing is indicative of a capacitance per unit foil thickness after compression in the case where the capacitance per unit foil thickness before compression is assumed to be 1. It should be noted that the foil thickness refers to a thickness of the entirety of the anode-use valve metal foil 11 including a thickness of the portion not roughened. The capacitance herein refers to a capacitance in the electrolytic solution per unit area when the dielectric oxide film 12 is formed after pressing the anode-use valve metal foil 11.

As seen from FIG. 2, the capacitance index per unit foil thickness exceeds 1 in the case where the rough surface layer of the capacitor forming part 11B in the anode-use valve metal foil 11 is compressed so that a rough surface layer thickness index of approximately 0.5 to 1 is obtained. In other words, a capacitance increasing effect can be achieved by compression. Furthermore, since the compression also results in the thinning of the anode-use valve metal foil 11, an effect of the thinning of the entire electrolytic capacitor is achieved also, and hence, the ESL value is decreased. Therefore, this provides reduction of the ESL as well as an increase in the capacitance. Such an effect can be achieved in second to eighth embodiments of the present invention that will be described later.

On the other hand, by pressing the electrode lead part 11A under a pressure higher than that for the capacitor forming part 11B, a bulk resistance of the rough surface layer can be lowered in the case where the electrode lead part 11A is connected electrically with the circuit wiring. This provides the lowering of resistances and the stability of electric connections. As a result, even in the case where the electrolytic capacitor of the present embodiment is built in a circuit board, it is possible to prevent the ESR value of the circuit board from rising due to the connection resistances between the electrolytic capacitor and the circuit wiring. Besides, as shown in FIG. 2, the capacitance index significantly decreases when the rough surface layer thickness index is less than 0.5. Therefore, by compressing the electrode lead part 11A so that the rough surface thickness index is not more than 0.5, the connection resistance can be decreased further. The effect of the further lowering of the connection resistance, which is achieved by compressing the electrode lead part so that the rough surface layer thickness index is not more than 0.5, can be achieved as well in the second to eighth embodiments that will be described later.

Furthermore, though the anode-use valve metal foil 11 preferably is made of aluminum, it is not limited to the same, and a foil made of any valve metal, such as tantalum or niobium, is applicable as the anode-use valve metal foil 11. Furthermore, the method for roughening the surfaces may be another method, such as direct current etching.

The cathode-use charge collecting layer 14 preferably is made of a Cu foil, a Ni foil, or an aluminum foil in which the carbon particles 15 are embedded by pressing for reducing an interface resistance between the same and the solid electrolyte layer 13 (reduction of ESR), or alternatively, it may be made of a cladding material composed of Cu or Ni that is solderable and an aluminum foil in which the carbon particles 15 are embedded. It should be noted that the cathode-use charge collecting layer 14 may be made of a carbon layer and an Ag paste layer, as is the case with the conventional electrolytic capacitor.

As described above, the electrolytic capacitor of the present embodiment is thin in thickness, does not have lead frames but rather connection terminals on upper and lower surfaces (the electrode lead part 11A and the cathode-use charge collecting layer 14). Therefore, it is small in size and achieves the shortening of connections in the case where it is embedded in a circuit board. Consequently, the reduction of the ESL can be achieved, and further, high-frequency driving is enabled in the case where the capacitor is built in a circuit board. More specifically, an aluminum foil having a thickness of approximately 40 $\mu$m to 150 $\mu$m (thickness before compression) is applicable as the anode-use valve metal foil 11A, and it is possible to allow the electrolytic capacitor to have a thickness of several hundreds $\mu$m. Therefore, it is possible to obtain an ESL value of not more than 1 nH.

Furthermore, in the present embodiment, the electrolytic capacitor has a two-terminal structure, with the electrode lead part 11A and the cathode-use charge collecting layer 14 being exposed. However, a three-terminal structure or a four terminal structure is obtained by molding at least one of the electrode lead part 11A and the cathode-use charge collecting layer 14 with the molding material 16 so that two portions are exposed so as to function as terminals. With this configuration, the anode-use valve metal foil 11 or the cathode-use charge collecting layer 14 functions as circuit wiring when the electrolytic capacitor is built in a circuit board, and therefore, it is possible to reduce the ESL further.

Furthermore, since the anode-use valve metal foil 11 is compressed beforehand, it is resistant to stress during a laminating operation or a molding operation, or when the electrolytic capacitor is built in a circuit board. Consequently, an electrolytic capacitor with high reliability can be obtained.

Furthermore, as to the lowering of the ESR, it is difficult to decrease the ESR of the conventional specialty polymer aluminum electrolytic capacitor to as low a level as that of the multilayered ceramic capacitor, and it cannot be achieved sufficiently by decreasing specific resistances of the conductive polymer layer, the carbon layer, and the Ag paste layer. This is evident from that, in the case where an electrolytic capacitor using a specialty polymer is compared with an electrolytic solution-type electrolytic capacitor, the specialty polymer has a degree of conductivity that is two or more digits greater than that of the electrolytic solution, but the electrolytic capacitor using the specialty polymer has an ESR that is only one digit or the like smaller than that of the electrolytic-solution-type electrolytic capacitor. Therefore, to lower the ESR, it is necessary to decrease an interface resistance between materials serving as a cathode. To decrease the interface resistance, compression to increase the interface surface between materials is effective, but another problem arises in that when a conventional specialty-polymer electrolytic capacitor is compressed, the rough surface layer of the valve metal deforms and the dielectric layer is damaged, thereby causing short circuits or an increase in leak current. However, since the electrolytic capacitor according to the present embodiment is composed of the anode-use valve metal foil 11 that has been compressed beforehand, a pressure, as long as it is not more than the pressure for pressing the capacitor forming part 11B, is allowed to be applied to the whole in the thickness direction upon bonding the cathode-use charge collecting layer 14. Thus, according to the electrolytic capacitor according to the present embodiment, it is possible to reduce interface resistances between the respective layers, thereby to lower the ESR to a level as low as that of the multilayered ceramic capacitor, while the damage to the anode-use valve metal foil 11 and the dielectric layer 12 due to the pressure is minimized.

It should be noted that in the present embodiment, after the rough surface layer of the anode-use valve metal foil 11 is compressed, the dielectric layer 12 and the solid electrolytic layer 13 are formed, and then, the dielectric layer 12 is repaired, so that the electrolytic capacitor is produced. However, after the dielectric layer 12 and the solid electrolyte layer 13 are formed on the roughened anode-use valve metal foil 11, the rough surface layer on the anode-use valve metal foil 11 may be compressed, and further, defects of the dielectric layer 12 may be repaired. According to this method, the compression is carried out after forming the solid electrolyte layer 13. Therefore, it is possible to fill spaces in the rough surface layer of the anode-use valve metal foil 11 with the solid electrolyte, and hence, it is possible to decrease the ESR.

Second Embodiment

FIGS. 3A to 3C illustrate a schematic configuration of an electrolytic capacitor of the present embodiment. FIGS. 3A, 3B, and 3C are a cross-sectional view, a top view, and a bottom view of the same, respectively. It should be noted that the top and the bottom of the electrolytic capacitor are defined merely for convenience of description, and a top and a bottom of the electrolytic capacitor according to the present embodiment are not specified particularly, when it is used. In FIGS. 3A to 3C, 17 denotes a conductive particle. The same members as those of the first embodiment will be denoted by the same reference numerals, and the description of the same is omitted herein.

The electrolytic capacitor of the present embodiment has substantially the same configuration as that of the electrolytic capacitor of the first embodiment, except that the conductive particles 17 are embedded in a portion of the electrode lead part 11A of the anode-use valve metal foil 11 that is to function as an electrode terminal. The following description will depict a method for producing an electrolytic capacitor according to the present embodiment.

First of all, for instance, an aluminum foil with a purity of 99.99% is subjected to electrolytic etching in an electrolytic solution containing hydrochloric acid mainly, with an alternating current applied to the aluminum foil, so that the aluminum foil has rough surfaces. Thus, the anode-use valve metal foil 11 is formed.

Then, the capacitor forming part 11B of the anode-use valve metal foil 11 is pressed by a press machine having a predetermined press shape or the like, so that rough surface layers of the same are pressed. Herein, the pressing preferably is carried out so that a ratio of a thickness of the rough surface layer after the pressing to a thickness of the same before the pressing is not less than 0.5.

Subsequently, the anode-use valve metal foil 11 is subjected to anodic oxidation in a neutral electrolytic solution, so that the dielectric layer 12 having a certain breakdown voltage is formed on surfaces of the anode-use valve metal foil 11.

Then, Au particles with a particle diameter of several μm, used as the conductive particles 17, are placed on the bottom surface portion of the electrode lead part 11A of the anode-use valve metal foil 11, and the electrode lead part 11A is pressed so that the Au particles are embedded therein. Through this process, the conductive particles 17 are embedded by breaking the dielectric layer 12 on the anode-use valve metal foil 11. Therefore, this provides reduction and stabilization of the connection resistance upon electric connection of the electrode lead part 11A with circuit wiring. Herein, it is necessary to carry out the pressing of the electrode lead part 11A under a higher pressure than that for the capacitor forming part 11B, to prevent the conductive particles 17 from falling off. Furthermore, as to the capacitor forming part 11B, the pressing preferably is carried out so that a ratio of a thickness of the rough surface layer after the pressing to a thickness of the same before the pressing is not less than 0.5, and further, so that spaces in the rough surface layer are eliminated.

Next, a predetermined portion (portion except for the capacitor forming part 11B) of the anode-use valve metal foil 11 is masked with the molding material 16, and the solid electrolyte layer 13 made of polypyrrole, polythiophene, polyaniline, etc. is formed by chemical polymerization, or chemical polymerization and electrolytic polymerization in combination, using a solution containing a dopant and respective monomers.

Thereafter, the same process as that in the first embodiment is carried out, whereby an electrolytic capacitor that is thin and that can be built in a circuit board is obtained.

It should be noted that the material for the conductive particles 17 is not limited to Au, and any material with suitable conductivity may be used. However, the material preferably is selected from Au, Ag, Cu, Ni, C, etc., which have low specific resistances and are stable.

As described above, with the electrolytic capacitor of the present embodiment, in which the conductive particles 17 are embedded in the electrode lead part 11A, it is possible to achieve an effect of reducing and stabilizing the connection resistance upon electric connection of the electrolytic capacitor with the circuit board, in addition to the effect obtained from the electrolytic capacitor of the first embodiment.

It should be noted that in the present embodiment as well, like in the first embodiment, after the dielectric layer 12 and the solid electrolyte layer 13 are formed on the roughened anode-use valve metal foil 11, the rough surface layer on the anode-use valve metal foil 11 may be compressed, and further, defects of the dielectric layer 12 may be repaired.

Third Embodiment

Figure 4:
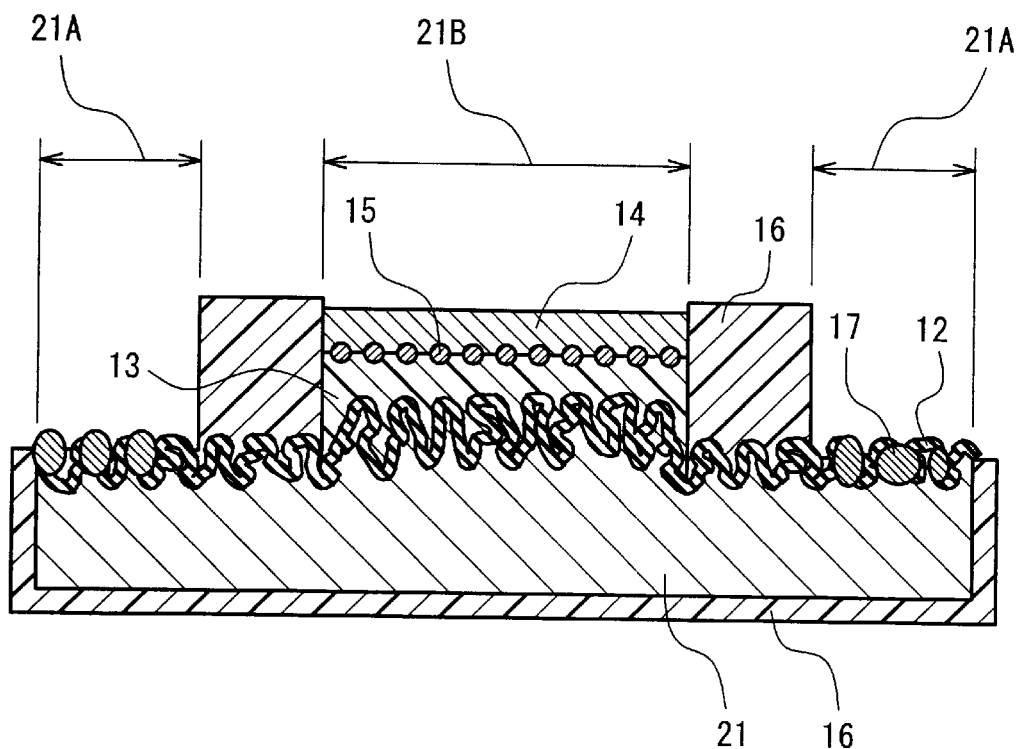
FIG. 4 is a cross-sectional view illustrating a configuration of an electrolytic capacitor according to a third embodiment of the present invention.

FIG. 4 is a cross-sectional view of an electrolytic capacitor according to the present embodiment. In FIG. 4, 21 denotes an anode-use valve metal foil. It should be noted that the same members as those of the first and second embodiments are denoted by the same reference numerals, and the description of the same is omitted herein.

The anode-use valve metal foil 21 in the electrolytic capacitor of the present embodiment differs from the anode-use valve metal foil 11 in the first and second embodiments in that only one surface thereof, on which the solid electrolyte layer 13 and the cathode-use charge collecting layer 14 are formed, is roughened. Further, the anode-use valve metal foil 21 includes an electrode lead part 21A and a capacitor forming part 21B, like the anode-use valve metal foil 11. Since a portion of the electrode lead part 21A that functions as an anode terminal is provided on a rough surface of the anode-use valve metal foil 21, the anode terminal and the cathode terminal (cathode-use charge collecting layer 14) are provided on the same surface (upper surface) of the electrolytic capacitor. Therefore, in the case where the electrolytic capacitor of the present embodiment is built in a circuit board, it is possible to obtain lead wires from the anode and the cathode from the same side of the electrolytic capacitor. Consequently, this allows the wiring to be shortened.

As described above, since the shortening of the wiring is achieved when the electrolytic capacitor of the present embodiment is built in a circuit board, an effect of making the electrolytic capacitor applicable to a high-frequency-driven circuit can be achieved, in addition to the effect achieved from the electrolytic capacitor according to the second embodiment.

It should be noted that the electrolytic capacitor of the present embodiment is formed through substantially the same process as that for forming the electrolytic capacitor of the second embodiment, except that in forming the anode-use valve metal foil 21, only one surface thereof is roughened in the case of the present embodiment. Moreover, the material of the anode-use valve metal foil 21 and the method for pressing the same are the same as those of the anode-use valve metal foil 11 of the first embodiment.

Fourth Embodiment

FIG. 5 is a cross-sectional view of an electrolytic capacitor according to the present embodiment. In FIG. 5, 18 denotes a conductive via hole. It should be noted that the same members as those of the first to third embodiments are denoted by the same reference numerals, and the description of the same is omitted herein.

The electrolytic capacitor of the present embodiment has substantially the same configuration as that of the electrolytic capacitor of the third embodiment, except that conductive via holes 18 are provided in a portion of the anode-use valve metal foil 21 other than the capacitor forming part 21B. The following description will depict a method for producing the electrolytic capacitor of the present embodiment.

An electrolytic capacitor of the third embodiment is produced, and through holes are formed in a portion other than the capacitor forming part 21B. Then, the molding material 16 is filled in the through holes, and cured. Thereafter, in the molding material 16 in the through holes that have been formed previously, additional through holes, which are to be via holes, are formed. A conductive paste is filled in these through holes, so that the conductive via holes 18 are formed. It should be noted that the method for forming the conductive via holes 18 is not limited to the filling of the conductive paste, and plating is applicable.

As described above, since the electrolytic capacitor of the present embodiment is provided with the conductive via holes 18, electric wires can be formed so as to pass through the electrolytic capacitor when the electrolytic capacitor is built in a circuit board. Therefore, in addition to an effect achieved by the electrolytic capacitor according to the third embodiment, higher densification and higher performance can be achieved.

Fifth Embodiment

FIGS. 6A to 6C illustrate a schematic configuration of an electrolytic capacitor of the present embodiment. FIGS. 6A, and 6B are a cross-sectional view, a top view, and a bottom view of the same, respectively. It should be noted that the top and the bottom of the electrolytic capacitor are defined merely for convenience in description, and a top and a bottom of the electrolytic capacitor according to the present embodiment are not specified particularly, when it is used. In FIGS. 6A to 6C, 31 denotes an anode-use valve metal foil, and 19 denotes a metal layer. The anode-use valve metal foil 31 includes a capacitor forming part 31B. The metal layer 19 functions as an electrode lead part. The same members as those of the first to fourth embodiments will be denoted by the same reference numerals, and the description of the same is omitted herein.

The electrolytic capacitor of the present embodiment has substantially the same configuration as that of the electrolytic capacitor of the first embodiment, except that conductive via holes 18 are provided in a portion of the anode-use valve metal foil 31 other than the capacitor forming part 31B.

The following description will depict a method for producing the electrolytic capacitor of the present embodiment.

An electrolytic capacitor of the first embodiment is produced, and through holes are formed in a portion other than the capacitor forming part 31B. Then, the molding material 16 is filled in the through holes, and cured. Thereafter, in the molding material 16 in the through holes that have been formed previously, additional through holes, which are to be via holes, are formed. A conductive paste is filled in the through holes, so that the conductive via holes 18 are formed. It should be noted that the method for forming the conductive via holes 18 is not limited to the filing of the conductive paste, and plating is applicable.

Since the electrolytic capacitor of the present embodiment is provided with the conductive via holes 18, electric wires can be formed so as to pass through the electrolytic capacitor when the electrolytic capacitor is built in a circuit board. Therefore, in addition to an effect achieved by the electrolytic capacitor according to the first embodiment, higher densification and higher performance can be achieved.

It should be noted that the electrolytic capacitor of the present embodiment may be an electrolytic capacitor that is formed according to the second embodiment and in which the conductive via holes 18 are formed by the same method as the aforementioned. Furthermore, a metal layer may be provided by plating or the like on a surface of the electrode lead part 31A (a surface electrically connected with the outside).

Sixth Embodiment

Figure 7A:
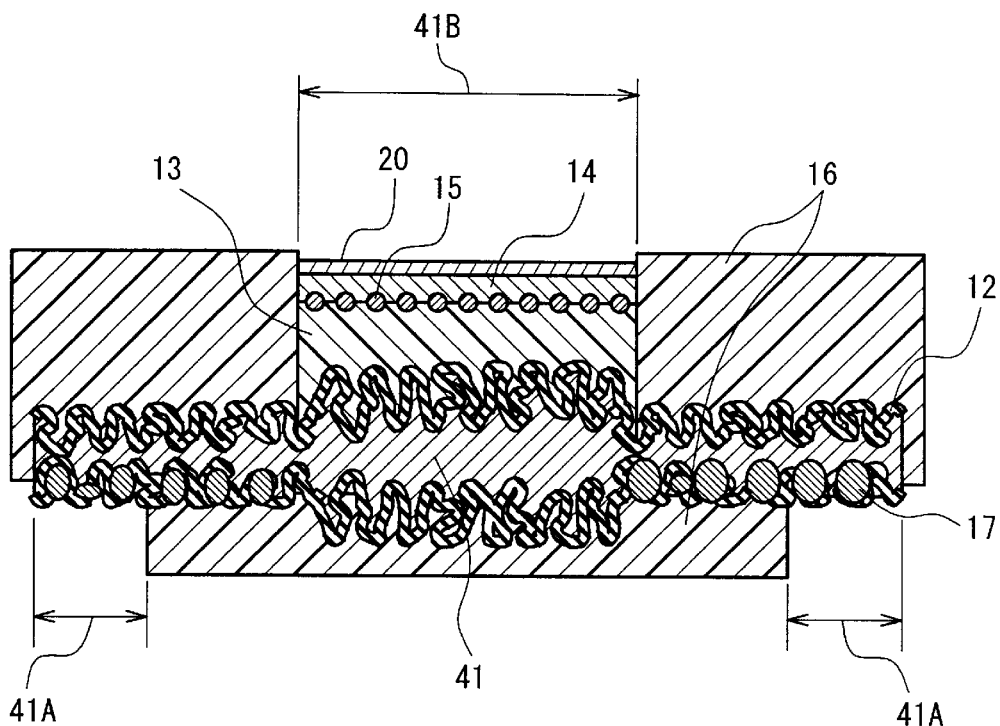
FIG. 7A is a cross-sectional view illustrating a configuration of an electrolytic capacitor according to a sixth embodiment of the present invention.
Figure 7B:
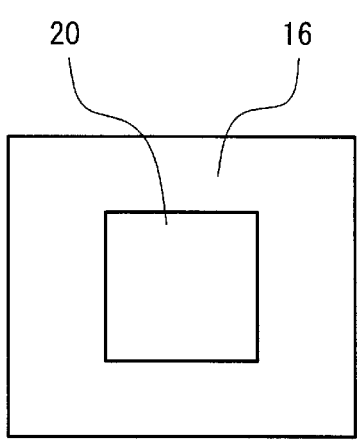
FIG. 7B is a top view of the electrolytic capacitor.
Figure 7C:
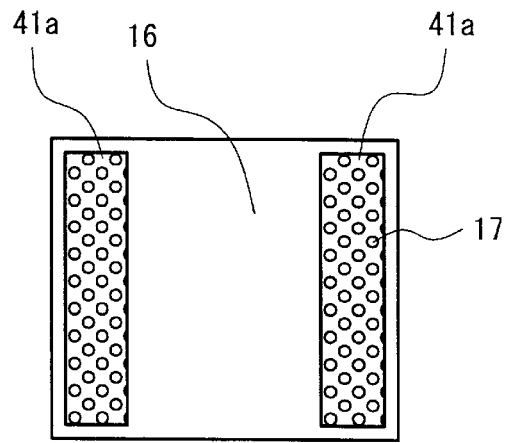
FIG. 7C is a bottom view of the electrolytic capacitor.

FIGS. 7A to 7C illustrate a schematic configuration of an electrolytic capacitor of the present embodiment. FIGS. 7A, 7B, and 7C are a cross-sectional view, a top view, and a bottom view of the same, respectively. It should be noted that the top and the bottom of the electrolytic capacitor are defined merely for convenience in description, and a top and a bottom of the electrolytic capacitor according to the present embodiment are not specified particularly, when it is used. In FIGS. 7A to 7C, 20 denotes a cathode-use charge collecting cladding layer, and 41 denotes an anode-use valve metal foil. The same members as those of the first to fifth embodiments will be denoted by the same reference numerals, and the description of the same are omitted herein.

The electrolytic capacitor of the present embodiment has substantially the same configuration as that of the electrolytic capacitor of the second embodiment, except that the cathode-use charge collecting cladding layer 20 is present, and that the molding material 16 is provided on both sides where the electrode lead part 41A is present so as to provide a multi-terminal structure. By using Cu or Ni to form the cathode-use charge collecting cladding layer 20, solderable electrodes can be provided.

The following description will depict a configuration of an electrolytic capacitor of the present embodiment, while depicting an embodiment of an electrolytic capacitor producing method of the present invention.

First of all, for instance, an aluminum foil with a purity of 99.99% is subjected to electrolytic etching in an electrolytic solution mainly containing hydrochloric acid, with an alternating current applied thereto, so that the aluminum foil has rough surfaces. Thus, the anode-use valve metal foil 41 is formed.

Then, the capacitor forming part 41B of the anode-use valve metal foil 41 is pressed by a press machine having a predetermined press shape or the like, so that rough surface layers of the same are pressed. Herein, the pressing is carried out so that a ratio of a thickness of the rough surface layer after the pressing to a thickness of the same before the pressing preferably is not less than 0.5.

Subsequently, the anode-use valve metal foil 41 is subjected to anodic oxidation in a neutral electrolytic solution, so that the dielectric layer 12 having a certain breakdown voltage is formed on surfaces of the anode-use valve metal foil 41.

Subsequently, Au particles with a particle diameter of several $\mu$m, used as the conductive particles 17, are placed on a lower surface of the electrode lead part 41A of the anode-use valve metal foil 41, and the electrode lead part 41A is pressed so that the Au particles are embedded therein.

Through this process, the conductive particles 17 are embedded by breaking the dielectric layer 12 on the anode-use valve metal foil 41. Therefore, this provides reduction and stabilization of the connection resistance upon electric connection of the electrode lead part 41A with circuit wiring. Herein, it is necessary to carry out the pressing of the electrode lead part 41A under a higher pressure than that for the capacitor forming part 41B, to prevent the conductive particles 17 from falling off. Furthermore, as to the pressing of the capacitor forming part 41A, the pressing preferably is carried out so that a ratio of a thickness of the rough surface layer after the pressing to a thickness of the same before the pressing preferably is not more than 0.5, and more preferably, so that spaces in the rough surface layer are crushed.

Next, a predetermined portion (portion except for the capacitor forming part 41B) of the anode-use valve metal foil 41 is masked with the molding material 16, and the solid electrolyte layer 13 made of polypyrrole, polythiophene, polyaniline, etc. is formed by chemical polymerization, or chemical polymerization and electrolytic polymerization in combination, using a solution containing a dopant and respective monomers.

On the other hand, a cladding material composed of a Cu or Ni foil (cathode-use charge collecting cladding layer 20) and an aluminum foil in which the carbon particles 15 are embedded by pressing or the like (cathode-use charge collecting layer 14) is used for collecting charges on the cathode side. On one surface of the cathode-use charge collecting layer 14, a conductive polymer layer made of polypyrrole, polythiophene, polyaniline, etc. may be formed by electrolytic polymerization using a solution containing a dopant and respective monomers. It should be noted that the cathode-use charge collecting layer 14 can be composed of a carbon layer and an Ag paste layer as conventionally. Further, the method for bonding the cathode-use charge collecting layer 14 and the solid electrolyte layer 13 is the same as that in the first embodiment. Therefore, it is possible to lower the ESR to a level as low as that of a multilayered ceramic capacitor, as is in the first embodiment.

Subsequently, the whole except for portions that are to function as an anode terminal and a cathode terminal is sealed with the molding material 16. Herein, it is sealed so that two anode terminals are obtained. Finally, hygroscopic aging and drying are carried out, whereby an electrolytic capacitor of the present embodiment is obtained.

The electrolytic capacitor of the present embodiment has a reduced ESL, not only because of the thinness of the anode-use valve metal foil 41 due to compression and the provision of connection terminals on both the upper and lower surfaces, but also because the anode-use valve metal foil 41 functions as circuit wiring in the case where the capacitor is built in a circuit board since the capacitor has a three-terminal structure having two anode terminals. Furthermore, the prior compression of the anode-use valve metal foil 41 improves the resistance of the capacitor against stress when the capacitor is built in a circuit board. Therefore, it is possible to provide an electrolytic capacitor that can be built in a circuit board. Furthermore, by using the electrolytic capacitor of the present embodiment, it is possible to obtain an electrolytic capacitor-containing circuit board that exhibits high densification and high performance.

It should be noted that in the electrolytic capacitor according to the present embodiment, the material of the conductive particles 17 is not limited to Au, but it may be any material as long as it has suitable conductivity. However, it preferably is selected from Au, Cu, Ni, C, and the like that have low specific resistances and are stable. Furthermore, the electrode lead part 41A in the electrolytic capacitor according to the present embodiment may be subjected to pressing without the conductive particles 17 embedded therein, or it may be provided with a metal layer by plating after the pressing.

Seventh Embodiment

FIG. 8 is a cross-sectional view of an electrolytic capacitor of the present embodiment. In FIG. 8, 51 denotes an anode-use valve metal foil. 51A denotes an electrode lead part. 51B denotes a capacitor forming part. 52 denotes a dielectric layer. 53 denotes a solid electrolyte layer. 54 denotes a carbon layer. 55 denotes an Ag paste layer. (The carbon layer 54 and the Ag paste layer 55 function as a cathode-use charge collecting layer). 56 denotes a conductive particle.

The following description will depict a configuration of an electrolytic capacitor of the present embodiment, while depicting an embodiment of an electrolytic capacitor producing method of the present invention.

First of all, for instance, an aluminum foil with a purity of 99.99% is subjected to electrolytic etching in an electrolytic solution containing hydrochloric acid mainly, with an alternating current applied thereto, so that the aluminum foil has rough surfaces. Thus, the anode-use valve metal foil 51 is formed.

Then, the anode-use valve metal foil 51 is subjected to anodic oxidation in a neutral electrolytic solution, so that the dielectric layer 52 having a certain breakdown voltage is formed on surfaces of the anode-use valve metal foil 51.

Next, the solid electrolyte layer 53 made of a conductive polymer such as polypyrrole, polythiophene, polyaniline, etc. is formed on the dielectric layer 52 by chemical polymerization, or chemical polymerization and electrolytic polymerization in combination, using a solution containing a dopant and respective monomers.

Subsequently, the capacitor forming part 51B of the anode-use valve metal foil 51, which has been roughened, is pressed by a plate press machine or a roller press machine in the thickness direction, and thereafter, it is subjected to anodic oxidation in an electrolytic solution based on an organic solvent, whereby the dielectric layer 52 is repaired.

Next, Au particles with a particle diameter of several sum, used as the conductive particles 56, are placed on the electrode lead part 51A of the anode-use valve metal foil 51, and the electrode lead part 51A is pressed by a plate press machine. Herein, the electrode lead part 51A is pressed under a higher pressure than that for the pressing of the capacitor forming part 51B.

Next, the carbon layer 54 is formed by dipping in a carbon-dispersed solution, and after drying the Ag paste layer 55 is formed in the same manner. As a result, an electrolytic capacitor of the present invention is obtained. Thereafter, the anode terminal and the cathode terminal may be connected individually as required, and further, the electrolytic capacitor except for portions that are to function as electrode terminals may be sealed with a molding material made of an epoxy resin or the like containing an inorganic filler such as silica. Furthermore, subsequently, repair of defects of the dielectric layer 12 and insulation of the solid electrolyte layer 13 may be carried out in an atmosphere of 80%RH at 85° C., with a predetermined voltage being applied.

Furthermore, in the electrolytic capacitor producing process according the present embodiment, the capacitor forming part 51B and the electrode lead part 51A of the anode-use valve metal foil 51 are pressed independently. However, upon the pressing of the capacitor forming part 51B, the electrode lead part 51A may by pressed simultaneously, and thereafter, placing the conductive particles 56 on the electrode lead part 51A, the electrode lead part 51A may be pressed under a higher pressure than that for the pressing of the capacitor forming part 51B.

The anode-use valve metal foil 51 preferably is made of aluminum, but it is not limited to the same, as long as it is composed of a foil of a valve metal such as tantalum, niobium, etc. The roughening method also may be another method, such as direct current etching.

Furthermore, a Cu foil, a Ni foil, and an aluminum foil, etc. in which carbon particles are embedded for reducing interface resistances may be used as the cathode-use charge collecting layer. Furthermore, as a charge collecting layer, a cladding material composed of a Cu foil or a Ni foil that is solderable and an aluminum foil in which carbon particles are embedded may be used.

It should be noted that the material of the conductive particles 56 is not limited to Au, and it may be any conductive material. However, it preferably is selected from Au, Ag, Cu, Ni, C, etc., which are stable.

Since the anode-use valve metal foil 51 is compressed beforehand, the electrolytic capacitor of the present embodiment is made resistant to stress during a laminating operation or a molding operation, or when the electrolytic capacitor is built in a circuit board, and is allowed to have stable connection resistances, thereby having high reliability.

Furthermore, the electrolytic capacitor of the present embodiment is thinned by pressing the anode-use valve metal foil 51, thereby achieving an effect of reduction of the ESL. Furthermore, by embedding the conductive particles 56 in the electrode lead part 51A, the electrolytic capacitor also achieves an effect of reduction and stabilization of connection resistances upon electric connection with a circuit board.

Eighth Embodiment

Figure 9:
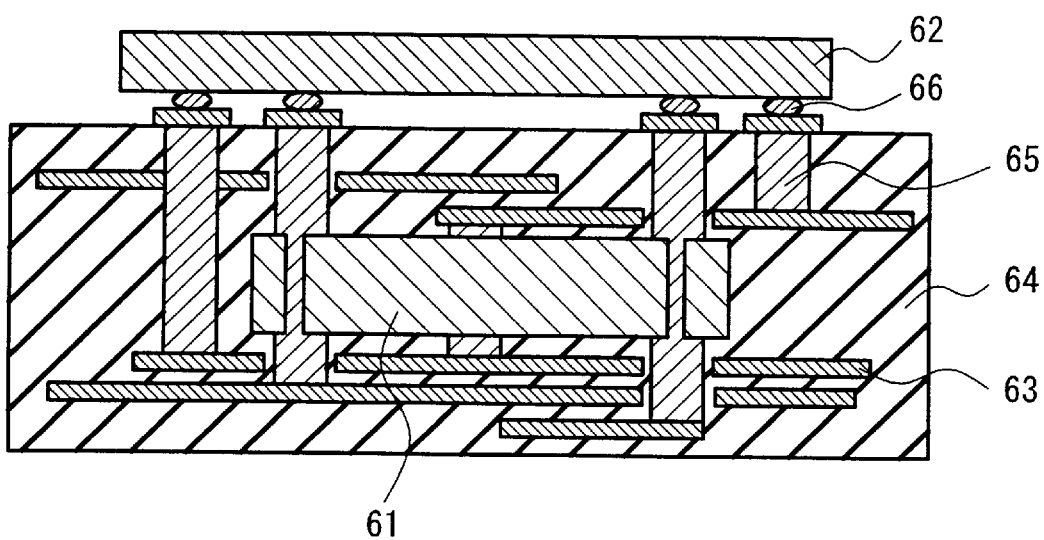
FIG. 9 is a cross-sectional view illustrating a configuration of an electrolytic-capacitor-containing circuit board according to an eighth embodiment of the present invention.

FIG. 9 is a cross-sectional view illustrating an embodiment of an electrolytic capacitor-containing circuit board of the present invention. In FIG. 9, 61 denotes an electrolytic capacitor shown in FIGS. 6A and 6B. 62 denotes a semiconductor chip. 63 denotes a circuit wire. 64 denotes an insulating material. 65 denotes a via hole. 66 denotes a bump.

The insulating material 64 preferably is made of a composite material of inorganic particles and a thermosetting resin, considering thermal expansion adjustment and heat dissipation.

Furthermore, the built-in electrolytic capacitor 61 is not necessarily provided with conductive via holes passing therethrough, and any one of the electrolytic capacitors of the present invention will suffice. Since the electrolytic capacitor of the present invention has a reduced ESR and a reduced ESL and has been subjected to compression in the producing process, it is resistant to stress caused by lamination and pressing when the capacitor is built in the board, and high reliability can be obtained.

Furthermore, since the capacitor-containing circuit board of the present invention is arranged so as to contain the electrolytic capacitor 61, the electrolytic capacitor 61 can be disposed directly below the semiconductor chip 62. Therefore, the circuit wiring can be shortened, and hence, a circuit board or a power source that can be driven at a high speed can be obtained. It should be noted that in the case where the electrolytic capacitor 61 is built in a board by pressing and lamination according to the method for producing the electrolytic capacitor-containing circuit board, the pressure upon the pressing and lamination should be lower than the pressure applied to the anode-use valve metal foil inside the electrolytic capacitor 61.

As described in conjunction with the above first through eighth embodiments, the present invention provides an electrolytic capacitor with low ESL that is subject to reduced stress upon being built in a circuit board, and hence, that can be built in a board. The present invention further provides a circuit board containing an electrolytic capacitor, which circuit board is capable of high-frequency response and large-current driving.

EXAMPLE

The following description will depict the present invention in more detail, referring to examples.

Example 1

An electrolytic capacitor according to the first embodiment was produced.

An aluminum foil with a purity of 99.99% and a thickness of 100 μm, used as the anode-use valve metal foil 11, was subjected to electrolytic etching in an electrolytic solution containing hydrochloric acid mainly at a concentration of 10 wt % at a liquid temperature of 35° C., with an alternating current applied thereto, so that the aluminum foil had a rough surface. The rough surface layer thus formed was 40 μm thick.

Subsequently, the capacitor forming part 11B of the anode-use valve metal foil 11 was pressed by a plate press machine so that the rough surface layer thereof was compressed to a compression level of 0.8.

Next, the electrode lead part 11A was pressed by a plate press machine so that the rough surface layer thereof was compressed to a compression level of 0.4.

Next, the anode-use valve metal foil 11 was subjected to constant voltage forming at a forming voltage of 8 V in a 5 wt % ammonium adipate aqueous solution at a liquid temperature of 60° C. as an anodic oxidation solution, so that the dielectric layer 12 was formed on surfaces of the anode-use valve metal foil 11.

Subsequently, a periphery of the anode-use valve metal foil 11 was masked so that a 5 mm square portion where a capacitor part was to be formed (equivalent to the capacitor forming part 11B) remained unmasked. The mask was formed by applying a molding material 16 made of an epoxy resin and curing the same.

Then, a solution containing a polythiophene monomer, an iron-based oxidant, and a dopant was dropped on a surface of the portion of the anode-use valve metal foil 11 that was to be the capacitor part, so that the solid electrolyte layer 13 was formed by chemical polymerization.

Thereafter, anodic oxidation was carried out in an organic-solvent-based electrolytic solution, so that the dielectric layer 12 was repaired.

On the other hand, as the cathode-use charge collecting layer 14, a Ni film having carbon particles 15 (acetylene black) embedded on one of surfaces thereof by pressing was used.

Next, the periphery was cut off so as to obtain a 10 mm square of the anode-use valve metal foil 11 including the 5 mm square capacitor part, on which the solid electrolyte layer 13 was formed. A conductive solution containing a conductive polymer was applied on the solid electrolyte layer 13, and the cathode-use charge collecting layer 14 was laminated thereon so that the solid electrolyte layer 13 and the cathode-use charge collecting layer 14 faced each other. Herein, a pressure not greater than the pressure having applied to the capacitor forming part 11B was applied, and the cathode-use charge collecting layer 14 and the solid electrolyte layer 13 were bonded with each other in the compressed state in a nitrogen atmosphere.

Thereafter, the epoxy-base molding material 16 containing an inorganic filler in a sheet-like form was applied to peripheral parts and cured, for sealing.

Next, the sealed piece was aged in an atmosphere at 80° C. and 80%RH so as to take up moisture while a constant voltage was applied thereto, and the dielectric layer 12 was repaired again. After drying, an electrolytic capacitor was obtained. It should be noted that a leak current value of the electrolytic capacitor of the present example was 1 $\mu$A or below even without aging.

The electrolytic capacitor thus obtained was approximately 250 $\mu$m thick. An electrolytic capacitor whose rough surface layer of the capacitor forming part 11B exhibited a compression level of 0.8 had a capacitance of approximately 14.5 $\mu$F at a frequency of 120 Hz, according to measurement of the frequency characteristic with an LCR meter. An ESR of the same was measured to be approximately 10 m$\Omega$ at a frequency of 100 kHz. From the relationship between the thickness of the electrolytic capacitor and the ESL measured by the resonance method, an ESL was determined to be approximately 0.2 nH. Thus, an ESL value of 1 nH or below, which was as low as that of a multilayered ceramic capacitor, was obtained, and a reduced ESR was obtained as well.

Furthermore, in the case where the foregoing electrolytic capacitor was built in a circuit board having an insulation layer made of a composite material, after being subjected to pressing, the leak current was approximately 0.4 $\mu$A. Thus, the condition thereof was excellent without any increase in the leak current.

Furthermore, the obtained circuit board excelled in stabilization of the driving voltages of semiconductor chips, as well as in absorption of high-frequency noises. Furthermore, in the case where an anode-use valve metal foil pressed under the same conditions as those for the electrode lead part 11A was bonded with circuit wiring with an Ag paste, a connection resistance thereof was measured to be several tens m$\Omega$.

Example 2

An electrolytic capacitor according to the second embodiment was produced.

An aluminum foil with a purity of 99.99% and a thickness of 100 $\mu$m, used as the anode-use valve metal foil 11, was subjected to electrolytic etching in an electrolytic solution containing hydrochloric acid mainly at a concentration of 10 wt % at a liquid temperature of 35° C., with an alternating current applied thereto, so that the aluminum foil had a rough surface. The rough surface layer thus formed was 40 $\mu$m thick.

Subsequently, the capacitor forming part 11B of the anode-use valve metal foil 11 was pressed by a plate press machine so that the rough surface layer thereof was compressed to a compression level of 0.5.

Next, the anode-use valve metal foil 11 was subjected to constant voltage forming at a forming voltage of 8 V in a 5 wt % ammonium adipate aqueous solution at a liquid temperature of 60° C. as an anodic oxidation solution, so that the dielectric layer 12 was formed on surfaces of the anode-use valve metal foil 11.

Then, Au particles, used as conductive particles 17, were placed on the electrode lead part 11A, and the electrode lead particle 11A was pressed also by a plate press machine so that the rough surface layer thereof was compressed to a compression level of 0.4.

Subsequently, a periphery of the anode-use valve metal foil 11 was masked so that only a 5 mm square portion where a capacitor part was to be formed (equivalent to the capacitor forming part 11B) remained unmasked. The mask was formed by applying a molding material 16 made of an epoxy resin and curing the same.

Then, a solution containing a polythiophene monomer, an iron-based oxidant, and a dopant was dropped on a surface of the portion of the anode-use valve metal foil 11 that was to be the capacitor part, so that the solid electrolyte layer 13 was formed by chemical polymerization.

Thereafter, anodic oxidation was carried out in an organic-solvent-based electrolytic solution, so that the dielectric layer 12 was repaired.

On the other hand, as the cathode-use charge collecting layer 14, a Ni film having carbon particles 15 (acetylene black) embedded on one of surfaces thereof by pressing was used.

Next, the periphery was cut off so as to obtain a 10 mm square of the anode-use valve metal foil 11 including the 5 mm square capacitor part, on which the solid electrolyte layer 13 was formed. A conductive solution containing a conductive polymer was applied on the solid electrolyte layer 13, and the cathode-use charge collecting layer 14 was laminated thereon so that the solid electrolyte layer 13 and the cathode-use charge collecting layer 14 faced each other. Herein, a pressure not greater than the pressure having applied to the capacitor forming part 11B was applied, and the cathode-use charge collecting layer 14 and the solid electrolyte layer 13 were bonded with each other in the compressed state in a nitrogen atmosphere.

Thereafter, the epoxy-base molding material 16 containing an inorganic filler in a sheet-like form was applied to peripheral parts and cured, for sealing.

Next, the sealed piece was aged in an atmosphere at 80° C. and 80% RH so as to take up moisture while a constant voltage was applied thereto, and the dielectric layer 12 was repaired again. After drying, an electrolytic capacitor was obtained. It should be noted that a leak current value of the electrolytic capacitor of the present example was 1 $\mu$A or below even without aging.

Figure 10:
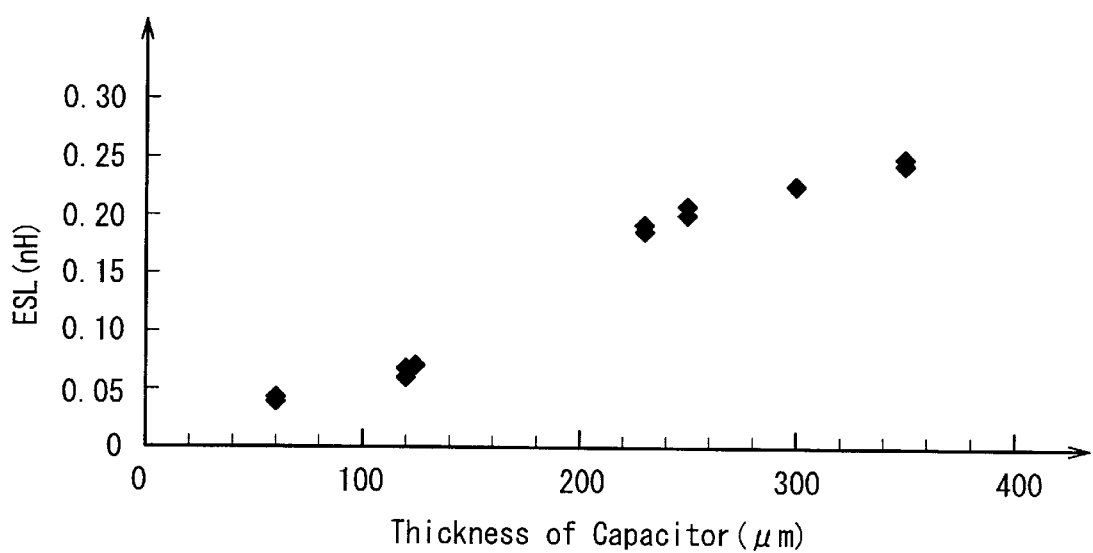
FIG. 10 is a diagram illustrating the relationship between a thickness of a capacitor and ESL.

The electrolytic capacitor thus obtained was approximately 230 $\mu$m thick. An electrolytic capacitor whose rough surface layer of the capacitor forming part 11B exhibited a compression level of 0.5 had a capacitance of approximately 13.0 $\mu$F at a frequency of 120 Hz, according to measurement of the frequency characteristic with an LCR meter. An ESR of the same was measured to be approximately 5 m$\Omega$ at a frequency of 100 kHz. As illustrated in FIG. 10, an ESL was approximately 0.19 nH. Thus, an ESL value of 1 nH or below, which was as low as that of a multilayered ceramic capacitor, was obtained, and a reduced ESR was obtained as well.

Furthermore, in the case where the foregoing electrolytic capacitor was built in a circuit board having an insulation layer made of a composite material, after being subjected to pressing, the leak current was approximately 0.6 μA. Thus, the condition thereof was excellent without any increase in the leak current.

Furthermore, the obtained circuit board excelled in stabilization of the driving voltages of semiconductor chips, as well as in absorption of high-frequency noises. Furthermore, in the case where an anode-use valve metal foil pressed under the same conditions as those for the electrode lead part 11A was bonded with circuit wiring with an Ag paste, a connection resistance thereof was measured to be several tens mΩ.

It should be noted that in the case where the electrolytic capacitor was built in a circuit board having an insulation layer made of a composite material, with a pressure greater than that for the capacitor forming part 11B having been applied thereto, the leak current (upon application of 4 V) was several μA, which was greater than the above.

Example 3

An electrolytic capacitor according to the fifth embodiment was produced.

An aluminum foil with a purity of 99.99% and a thickness of 100 μm, used as the anode-use valve metal foil 31, was subjected to electrolytic etching in an electrolytic solution containing hydrochloric acid mainly at a concentration of 10 wt % at a liquid temperature of 35° C., with an alternating current applied thereto, so that the aluminum foil had a rough surface. The rough surface layer thus formed was 40 μm thick.

Subsequently, the capacitor forming part 31B of the anode-use valve metal foil 31 was pressed by a plate press machine so that the rough surface layer thereof was compressed to a compression level of 0.8.

Next, the electrode lead part 31A was pressed by a plate press machine so that the rough surface layer thereof was compressed to a compression level of 0.4.

Next, the anode-use valve metal foil 31 was subjected to constant voltage forming at a forming voltage of 8 V in a 5 wt % ammonium adipate aqueous solution at a liquid temperature of 60° C. as an anodic oxidation solution, so that the dielectric layer 12 was formed on surfaces of the anode-use valve metal foil 31.

Subsequently, a periphery of the anode-use valve metal foil 31 was masked so that a 5 mm square portion where a capacitor part was to be formed (equivalent to the capacitor forming part 31B) remained unmasked. The mask was formed by applying a molding material 16 made of an epoxy resin and curing the same.

Then, a solution containing a polythiophene monomer, an iron-based oxidant, and a dopant was dropped on a surface of the portion of the anode-use valve metal foil 31 that was to be the capacitor part, so that the solid electrolyte layer 13 was formed by chemical polymerization.

Thereafter, anodic oxidation was carried out in an organic-solvent-based electrolytic solution, so that the dielectric layer 12 was repaired.

On the other hand, as the cathode-use charge collecting layer 14, a Ni film having carbon particles 15 (acetylene black) embedded on one of surfaces thereof by pressing was used.

Next, the periphery was cut off so as to obtain a 10 mm square of the anode-use valve metal foil 31 including the 5 mm square capacitor part, on which the solid electrolyte layer 13 was formed. A conductive solution containing a conductive polymer was applied on the solid electrolyte layer 13, and the cathode-use charge collecting layer 14 was laminated thereon so that the solid electrolyte layer 13 and the cathode-use charge collecting layer 14 faced each other. Herein, the pressure applied was not greater than the pressure having applied to the capacitor forming part 31B, and the cathode-use charge collecting layer 14 and the solid electrolyte layer 13 were bonded with each other in the compressed state in a nitrogen atmosphere.

Thereafter, the epoxy-base molding material 16 containing an inorganic filler in a sheet-like form was applied to peripheral parts and cured, for sealing.

Then, through holes necessary in the periphery of the capacitor part were formed by metal punching or the like, and the mask was removed from the through hole portions. Then, the whole except for parts to function as an anode terminal and a cathode terminal was sealed with the molding material 16, and thereafter, additional through holes were bored in the previously-formed through holes filled with the molding material 16, in sizes such that the anode-use valve metal foil 31 was not exposed, and a Cu paste was applied, so that the conductive via holes 18 were formed.

Next, it was aged in an atmosphere at 80° C. and 80% RH so as to take up moisture while a constant voltage was applied thereto, and the dielectric layer 12 was repaired again. After drying, an electrolytic capacitor was obtained. It should be noted that a leak current value of the electrolytic capacitor of the present example was 1 μA or below even without aging.

The electrolytic capacitor thus obtained was approximately 250 μm thick. An electrolytic capacitor whose rough surface layer of the capacitor forming part 31B exhibited a compression level of 0.8 had a capacitance of approximately 14.5 μF at a frequency of 120 Hz, according to measurement of the frequency characteristic with an LCR meter. An ESR of the same was measured to be approximately lo mΩ at a frequency of 100 kHz. An ESL was approximately 0.2 nH. Thus, an ESL value of 1 nH or below, which was as low as that of a multilayered ceramic capacitor, was obtained, and a reduced ESR was obtained as well.

Furthermore, in the case where the foregoing electrolytic capacitor was built in a circuit board having an insulation layer made of a composite material, after being subjected to pressing, the capacitance did not exhibit any change after that, and the leak current was approximately 0.4 μA. Thus, the condition thereof was excellent without any increase in the leak current.

Furthermore, since the electrolytic capacitor of the present example had conductive via holes 18, the circuit board containing the electrolytic capacitor allowed high-density wiring, excelled in stabilization of driving voltages of semiconductor chips, as well as in absorption of high-frequency noises. Besides, in the case where via holes whose circumferences were plated by non-electrolytic Ni plating and that were filled with a Cu paste were formed as the conductive via holes 18, the same performance was provided.

Example 4

An electrolytic capacitor according to the sixth embodiment was produced.

An aluminum foil with a purity of 99.99% and a thickness of 100 μm, used as the anode-use valve metal foil 41, was subjected to electrolytic etching in an electrolytic solution containing hydrochloric acid mainly at a concentration of 10 wt % at a liquid temperature of 35° C., with an alternating current applied thereto, so that the aluminum foil had a rough surface. The rough surface layer thus formed was 40 μm thick.

Subsequently, the capacitor forming part 41B of the anode-use valve metal foil 41 was pressed by a plate press machine so that the rough surface layer thereof was compressed to a compression level of 0.5.

Next, the anode-use valve metal foil 41 was subjected to constant voltage forming at a forming voltage of 8 V in a 5 wt % ammonium adipate aqueous solution at a liquid temperature of 60° C. as an anodic oxidation solution, so that the dielectric layer 12 was formed on surfaces of the anode-use valve metal foil 41.

Then, Au particles as conductive particles 17 were placed on the electrode lead part 41A, and the electrode lead particle 41A was pressed also by a plate press machine so that the rough surface layer thereof was compressed to a compression level of 0.4.

Subsequently, a periphery of the anode-use valve metal foil 41 was masked so that only a 5 mm square portion where a capacitor part was to be formed (equivalent to the capacitor forming part 41B) remained unmasked. The mask was formed by applying a molding material 16 made of an epoxy resin and curing the same.

Then, a solution containing a polythiophene monomer, an iron-based oxidant, and a dopant was dropped on a surface of the portion of the anode-use valve metal foil 41 that was to be the capacitor part, so that the solid electrolyte layer 13 was formed by chemical polymerization.

Thereafter, anodic oxidation was carried out in an organic-solvent-based electrolytic solution, so that the dielectric layer 12 was repaired.

On the other hand, as the cathode-use charge collecting layer 14, an aluminum film having carbon particles 15 (acetylene black) embedded on one of surfaces thereof by pressing was used. As the cladding layer 20, a Cu foil was used.

Next, the periphery was cut off so as to obtain a 10 mm square of the anode-use valve metal foil 41 including the 5 mm square capacitor part, on which the solid electrolyte layer 13 was formed. A conductive solution containing a conductive polymer was applied on the solid electrolyte layer 13, and the cathode-use charge collecting layer 14 was laminated thereon so that the solid electrolyte layer 13 and the cathode-use charge collecting layer 14 faced each other. Herein, a pressure not greater than the pressure applied to the capacitor forming part 41B was applied, and the cathode-use charge collecting layer 14 and the solid electrolyte layer 13 were bonded with each other in the compressed state in a nitrogen atmosphere.

Thereafter, the molding material 16 was applied except for two portions on the electrode lead part 41 (that are to function as anode terminals).

Next, the sealed piece was aged in an atmosphere at 80° C. and 80%RH so as to take up moisture while a constant voltage was applied thereto, and the dielectric layer 12 was repaired again. After drying, an electrolytic capacitor was obtained. It should be noted that a leak current value of the electrolytic capacitor of the present example was 1 μA or below even without aging.

The electrolytic capacitor thus obtained was approximately 350 μm thick. An electrolytic capacitor whose rough surface layer of the capacitor forming part 41B exhibited a compression level of 0.5 had a capacitance of approximately 13.0 μF at a frequency of 120 Hz, according to measurement of the frequency characteristic with an LCR meter. An ESR of the same was measured by using one of the two portions of the electrode lead part 41A as an anode terminal so that the capacitor functioned as a two-terminal-structure capacitor, and it was determined to be approximately 5 mΩ at a frequency of 100 kHz. An ESL was approximately 0.25 nH. Thus, an ESR value as low as that of a multilayered ceramic capacitor was obtained, and a reduced ESL was obtained as well.

Furthermore, in the case where the foregoing electrolytic capacitor was built in a circuit board having an insulation layer made of a composite material, after being subjected to pressing, the leak current was approximately 0.3 μA. Thus, the condition thereof was excellent without any increase in the leak current.

Furthermore, since the electrolytic capacitor of the present example had a three-terminal structure, the ESL caused by an anode of the electrolytic capacitor in the state of being built in a circuit board was ignorable. Therefore, the circuit board containing the electrolytic capacitor excelled in stabilization of driving voltages of semiconductor chips, as well as in absorption of high-frequency noises.

Example 5

An electrolytic capacitor according to the seventh embodiment was produced.

An aluminum foil with a purity of 99.99% and a thickness of 100 μm, used as the anode-use valve metal foil 51, was subjected to electrolytic etching in an electrolytic solution containing hydrochloric acid mainly at a concentration of 10 wt % at a liquid temperature of 35° C., with an alternating current applied thereto, so that both surfaces of the aluminum foil were subjected to electrolytic etching and roughened. The rough surface layer thus formed was 40 μm thick.

Next, the anode-use valve metal foil 51 was cut out and subjected to constant voltage forming at a forming voltage of 8 V in a 5 wt % ammonium adipate aqueous solution at a liquid temperature of 60° C. as an anodic oxidation solution, so that the dielectric layer 52 was formed on surfaces of the anode-use valve metal foil 51.

Subsequently, an effective portion of the anode-use valve metal foil 51 where a capacitor part was to be formed (equivalent to the capacitor forming part 51B) was defined so as to be 3.5 mm square in size. A solution containing a polythiophene monomer, an iron-based oxidant, and a dopant was dropped on the surface portion to be a capacitor part, so that the solid electrolyte layer 13 was formed thinly by chemical polymerization. Thereafter, the solid electrolyte layer 13 was formed sufficiently by electrolytic polymerization.

Subsequently, the capacitor forming part 51B of the anode-use valve metal foil 51, whose surface had been roughened, was pressed by a plate press machine or a roller press machine, and thereafter, anodic oxidation was carried out in an organic-solvent-based electrolytic solution, so that the dielectric layer 12 was repaired. Then, Au particles, used as conductive particles 56, were placed on the electrode lead part 51A, and the electrode lead particle 51A was pressed also by a plate press machine.

Next, the carbon layer 54 and the Ag paste layer 55 were formed on the solid electrolyte layer 53 by dipping and heating.

The electrolytic capacitor thus obtained had a capacitance of approximately 14 μF at a frequency of 120 Hz, according to measurement of the frequency characteristic with an LCR meter. An ESR of the same was measured to be approximately 20 mΩ at a frequency of 100 kHz. Thus, the lowering of the ESR was achieved. The size was reduced for the absence of lead frames as compared with a conventional capacitor. Therefore, this allows the wiring to be shortened when the electric capacitor is built in a circuit board, and the circuit board provides excellent performance. The leak current was approximately 0.6 µA.

Furthermore, in the case where the foregoing electrolytic capacitor of the present example that was arranged so as to be connected electrically with circuit wiring via the Ag paste layer 55 was built in a circuit board having an insulation layer made of a composite material, after being subjected to pressing, the leak current (upon application of 4 V) was approximately 0.6 µA, which was substantially equal to that before incorporation. It should be noted that the pressing was carried out under a pressure smaller than that used for the pressing of the capacitor forming part 51B. Furthermore, the circuit board containing the electrolytic capacitor exhibited only a small voltage drop due to resistances, and excelled in high-frequency response and driving stabilization at a low driving voltage.

Comparative Example

Figure 11:
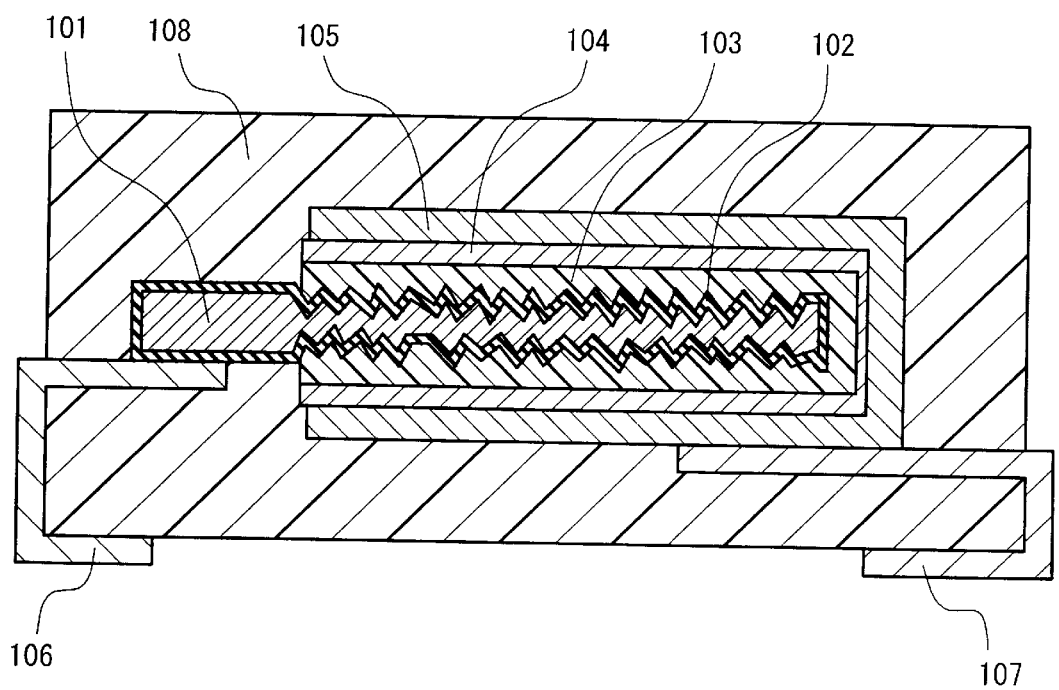
FIG. 11 is a cross-sectional view illustrating a configuration of a conventional specialty polymer electrolytic capacitor.

A conventional specialty polymer conductive capacitor shown in FIG. 11 was produced.

An aluminum foil with a purity of 99.99% and a thickness of 100 µm, used as the anode-use aluminum foil 101, was subjected to electrolytic etching in an electrolytic solution containing hydrochloric acid mainly at a concentration of 10 wt % at a liquid temperature of 35° C., with an alternating current applied thereto, so that both surfaces of the aluminum foil were subjected to electrolytic etching and roughened. The rough surface layer thus formed was 40 µm thick.

Next, the anode-use aluminum foil 101 was cut out and subjected to constant voltage forming at a forming voltage of 8 V in a 5 wt % ammonium adipate aqueous solution at a liquid temperature of 60° C. as an anodic oxidation solution, so that the dielectric layer 102 was formed on both the surfaces of the anode-use aluminum foil 101.

Subsequently, an effective portion of the anode-use aluminum foil 101 where a capacitor part was to be formed was defined so as to be 3.5 mm square in size. A solution containing a polythiophene monomer, an iron-based oxidant, and a dopant was dropped on the surface portion to be a capacitor part, so that the conductive polymer layer 103 was formed thinly by chemical polymerization. Thereafter, the conductive polymer layer 103 was thickened sufficiently by electrolytic polymerization.

Subsequently, the carbon layer 104 and the Ag paste layer 105 were formed on the conductive polymer layer 103 by dipping and heating. After the lead frame 106 was welded to the aluminum foil and the lead frame 107 was bonded with an Ag paste, the molding resin 108 was molded by transfer molding.

Finally, it was aged in an atmosphere at 80° C. and 80% RH so as to take up moisture while a constant voltage was applied thereto, and the dielectric layer 102 was repaired again. After drying, a conventional specialty polymer electrolytic capacitor was obtained.

The specialty polymer electrolytic capacitor had a capacitance of approximately 14 µF at a frequency of 120 Hz, according to measurement of the frequency characteristic with an LCR meter. An ESR of the same was measured to be approximately 20 mΩ at a frequency of 100 kHz, an ESL was approximately 3 nH, and leak current was approximately 0.5 µA.

Furthermore, in the case where the foregoing conventional specialty polymer electrolytic capacitor was built in a circuit board having an insulation layer made of a composite material, after being subjected to pressing, the leak current after incorporation (upon application of 4 V) was several hundreds µA to several µA, and many short circuits were observed.

Furthermore, in the case where a specialty polymer electrolytic capacitor in a state of not being molded was built in a composite board in the same manner so that the capacitor was connected electrically with circuit wiring via the Ag paste layer 105, the leak current (upon application of 4 V) was several hundreds µA or more, and most suffered from short circuits. Furthermore, in the case where the conventional surface-roughened anode-use aluminum foil 101 used therein was connected with circuit wiring via the Ag paste, a connection resistance of the same was measured to be several Ω to several tens Ω.

Thus, it was confirmed that, according to the configurations of the electrolytic capacitors according to Examples 1 to 5 and the method for producing the same, the electrolytic capacitors not only were formed thinner but also achieved an effect of reduction of the ESL, an excellent stress-resistance effect that allows the incorporation in a circuit board, and an effect of the connection with a low resistance when it is built in a circuit board, as compared with the conventional specialty polymer electrolytic capacitor. Furthermore, it was confirmed also that the circuit board containing the electrolytic capacitor according to the examples excelled in the stabilization of driving voltages of semiconductor chips and the absorption of high-frequency noises.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electrolytic capacitor, comprising:
    a valve metal element for an anode including a capacitor forming part and an electrode lead part;
    a dielectric layer provided on a surface of the valve metal element for anode;
    a solid electrolyte layer provided on the dielectric layer; and
    a charge collecting element for a cathode provided on the solid electrolyte layer,
    wherein, in the valve metal element for an anode, the capacitor forming part and the electrode lead part have a rough surface layer on surfaces thereof, and are compressed in a thickness direction of the rough surface layer.

2. The electrolytic capacitor according to claim 1, further comprising:
    a conductive via hole bored entirely through in a thickness direction, the conductive via hole being provided in a region other than the capacitor forming part, and being insulated electrically from the valve metal element for an anode, the solid electrolyte layer, and the charge collecting element for a cathode.

3. The electrolytic capacitor according to claim 1, wherein a thickness index of the rough surface layer in the capacitor forming part after compression is not less than 0.5 and less than 1.0,
    where the thickness index of the rough surface layer after compression is a thickness of the rough surface layer after compression in the case where a thickness of the rough surface layer before compression is assumed to be 1.

4. The electrolytic capacitor according to claim 1, wherein a thickness index of the rough surface layer in the electrode lead part after compression is not more than 0.5, where the thickness index of the rough surface layer after compression is a thickness of the rough surface layer after compression in the case where a thickness of the rough surface layer before compression is assumed to be 1.

5. The electrolytic capacitor according to claim 1, wherein conductive particles are embedded in the electrode lead part so that the conductive particles are exposed on a surface of the electrode lead part.

6. The electrolytic capacitor according to claim 5, wherein the conductive particles are selected from the group consisting of Au particles, Ag particles, Cu particles, Ni particles, and C particles.

7. The electrolytic capacitor according to claim 1, wherein the charge collecting element for a cathode is made of a metal foil in which carbon particles are embedded so that the particles are exposed on a surface of the metal foil.

8. The electrolytic capacitor according to claim 1, wherein the charge collecting element for cathode is a cladding material, the cladding material including:
   a metal foil in which carbon particles are embedded so that the particles are exposed on a surface of the metal foil; and
   a cladding layer.

9. The electrolytic capacitor according to claim 1, wherein the capacitor forming part and the electrode lead part are provided on a same plane of the valve metal element for anode.

10. The electrolytic capacitor according to claim 1, wherein:
   the capacitor forming part is provided on a first side of the valve metal element for an anode; and
   the electrode lead part is provided on a second side of the valve metal element for an anode, the second side being opposite to the first side.

11. The electrolytic capacitor according to claims 1, wherein:
   the valve metal element for an anode includes a valve metal layer and a metal layer.

12. The electrolytic capacitor according to claim 11, wherein the metal layer is made of Cu or Ni.

13. The electrolytic capacitor according to claim 1, wherein a region other than a predetermined portion of the electrode lead part and a predetermined portion of the charge collecting element for cathode is sealed with a molding material.

14. The electrolytic capacitor according to claim 13, wherein at least one of the electrode lead part and the charge collecting element for a cathode has a plurality of portions not covered with the molding material.

15. A method for producing the electrolytic capacitor according to claim 1, the method comprising:
   roughening at least a surface of a portion of the valve metal element for an anode, the portion being that to be the capacitor forming part; and
   compressing the roughened surface portion of the valve metal element for anode in the thickness direction.

16. The method according to claim 15, wherein the compressing step is carried out so that a thickness index of the rough surface layer in the capacitor forming part after compression is not less than 0.5 and less than 1.0, where the thickness index of the rough surface layer after compression is a thickness of the rough surface layer after compression in the case where a thickness of the rough surface layer before compression is assumed to be 1.

17. The method according to claim 15, wherein the compressing step is carried out so that a thickness index of the rough surface layer in the electrode lead part after compression is not more than 0.5, where the thickness index of the rough surface layer after compression is a thickness of the rough surface layer after compression in the case where a thickness of the rough surface layer before compression is assumed to be 1.

18. The method according to claim 15, further comprising the step of:
   placing conductive particles on the electrode lead part in a state in which the dielectric layer is formed on a surface of the electrode lead part, and compressing the electrode lead part so that the conductive particles are embedded in the electrode lead part.

19. The method according to claim 15, further comprising the steps of:
   forming the dielectric layer;
   forming the solid electrolyte layer; and
   repairing the dielectric layer,
   wherein the roughening step, the dielectric layer forming step, the solid electrolyte layer forming step, the compressing step, and the dielectric layer repairing step are carried out in the stated order.

20. A circuit board comprising the electrolytic capacitor according to claim 1.

21. The circuit board according to claim 20, wherein:
   the electrolytic capacitor is embedded in an insulation material having a wire layer; and
   the electrode lead part of the valve metal element for an anode and the charge collecting element for a cathode are connected individually with the wire layer.

22. The circuit board according to claim 21, wherein the insulation material is a composite material containing inorganic material particles and a thermosetting resin.

23. A method for producing the electrolytic-capacitor-containing circuit board according to claim 20, the method comprising:
   burying the electrolytic capacitor in the insulation material in a non-cured state by pressing,
   wherein a pressure in the burying step is smaller than a pressure applied to the capacitor forming part of the valve metal element for an anode of the electrolytic capacitor when it is compressed.

* * * * *

UNITED STATES PATENT AND TRADEMARK OFFICE
CERTIFICATE OF CORRECTION

PATENT NO.      : 6,504,705 B2                                      Page 1 of 1
DATED           : January 7, 2003
INVENTOR(S)     : Shimada et al.

It is certified that error appears in the above-identified patent and that said Letters Patent is hereby corrected as shown below:

<u>Column 27,</u>
Line 43, "according to claims 1," should read -- according to claim 1, --

Signed and Sealed this

Thirtieth Day of September, 2003

JAMES E. ROGAN
*Director of the United States Patent and Trademark Office*